US012588136B2

(12) United States Patent
Hong

(10) Patent No.: US 12,588,136 B2
(45) Date of Patent: Mar. 24, 2026

(54) PRINTED CIRCUIT BOARD COMPRISING GROUND WIRE

(71) Applicant: SAMSUNG ELECTRONICS CO., LTD., Suwon-si (KR)

(72) Inventor: Eunseok Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 455 days.

(21) Appl. No.: 17/946,794

(22) Filed: Sep. 16, 2022

(65) Prior Publication Data

US 2023/0009036 A1 Jan. 12, 2023

Related U.S. Application Data

(63) Continuation of application No. PCT/KR2021/002283, filed on Feb. 24, 2021.

(30) Foreign Application Priority Data

Mar. 18, 2020 (KR) ......................... 10-2020-0033497

(51) Int. Cl.
*H05K 1/02* (2006.01)
*H05K 1/11* (2006.01)

(52) U.S. Cl.
CPC .......... *H05K 1/0219* (2013.01); *H05K 1/028* (2013.01); *H05K 1/115* (2013.01); *H05K 2201/10098* (2013.01)

(58) Field of Classification Search
CPC .. H05K 1/0219; H05K 1/0222; H05K 1/0231; H05K 1/0251; H05K 1/09809; H05K 1/09627; H05K 1/09672
See application file for complete search history.

(56) References Cited

U.S. PATENT DOCUMENTS 5,712,607 A * 1/1998 Dittmer ................... H01P 3/087
333/246
5,830,301 A * 11/1998 Sturzebecher ............ H01P 3/06
333/236

(Continued)

FOREIGN PATENT DOCUMENTS

CN 101095381 A 12/2007
JP 2010-73891 A 4/2010

(Continued)

OTHER PUBLICATIONS

Communication issued on Sep. 25, 2023 by the European Patent Office for European Patent Application No. 21771648.9.

(Continued)

*Primary Examiner* — Paresh Paghadal
(74) *Attorney, Agent, or Firm* — Sughrue Mion, PLLC

(57) ABSTRACT

A printed circuit board includes: a first layer including a first ground including a first opening, wherein a first ground wire is within the first opening; a second layer disposed in a direction from the first layer and including a second ground including a second opening, wherein the second opening at least partially overlaps with the first opening and wherein a second ground wire is within the second opening; a third layer between the first layer and the second layer and including a third opening, wherein the third opening at least partially overlaps with the first opening and wherein a first via pad is within the third opening; and a fourth layer between the second layer and the third layer and including a fourth opening, wherein the fourth opening at least partially overlaps with the third opening and wherein a second via pad is within the fourth opening.

19 Claims, 14 Drawing Sheets

(56) References Cited

U.S. PATENT DOCUMENTS

| | | | | |
|---|---|---|---|---|
| 6,518,844 B1 * | 2/2003 | Sherman | H01P 3/087 | 330/53 |
| 6,523,252 B1 * | 2/2003 | Lipponen | H01P 3/06 | 29/850 |
| 6,535,088 B1 * | 3/2003 | Sherman | H05K 1/024 | 333/246 |
| 6,977,745 B2 * | 12/2005 | Sharma | G06F 21/608 | 358/1.15 |
| 8,164,005 B2 * | 4/2012 | Yamashita | H05K 1/0251 | 174/250 |
| 11,564,316 B2 * | 1/2023 | Zamarron | H05K 1/0237 | |
| 2001/0040051 A1 * | 11/2001 | Lipponen | H05K 1/0219 | 174/262 |
| 2001/0040490 A1 * | 11/2001 | Tanaka | H01P 3/088 | 333/204 |
| 2002/0034839 A1 | 3/2002 | Iwaki et al. | | |
| 2002/0044098 A1 * | 4/2002 | Von Stein | H01Q 13/106 | 343/770 |
| 2002/0130737 A1 | 9/2002 | Hreish et al. | | |
| 2003/0133279 A1 | 7/2003 | Shirasaki | | |
| 2005/0011676 A1 | 1/2005 | Barr et al. | | |
| 2005/0098348 A1 * | 5/2005 | Okumichi | H01L 23/66 | 174/262 |
| 2006/0091545 A1 | 5/2006 | Casher et al. | | |
| 2009/0122498 A1 | 5/2009 | Lan et al. | | |
| 2010/0065321 A1 | 3/2010 | Kashiwakura | | |
| 2010/0182105 A1 | 7/2010 | Hein et al. | | |
| 2012/0048599 A1 | 3/2012 | Lin | | |
| 2012/0175782 A1 | 7/2012 | Im et al. | | |
| 2014/0077896 A1 * | 3/2014 | Lee | H03H 7/17 | 333/185 |
| 2014/0099123 A1 | 4/2014 | Kang et al. | | |
| 2014/0102778 A1 * | 4/2014 | Shiozaki | H05K 1/115 | 174/266 |
| 2015/0091675 A1 * | 4/2015 | Kato | H01P 3/084 | 333/238 |
| 2015/0214142 A1 * | 7/2015 | Kariyazaki | H01L 23/5225 | 257/773 |
| 2015/0327359 A1 * | 11/2015 | Tuominen | H01P 3/08 | 333/238 |
| 2017/0150594 A1 * | 5/2017 | Jones | H05K 1/0251 | |
| 2018/0027647 A1 | 1/2018 | Rengarajan et al. | | |
| 2018/0206331 A1 * | 7/2018 | Kim | H05K 3/4691 | |
| 2019/0053379 A1 * | 2/2019 | Kim | H05K 1/0221 | |
| 2020/0194378 A1 * | 6/2020 | Tang | H01L 23/552 | |
| 2020/0259234 A1 * | 8/2020 | Watanabe | H05K 1/0233 | |

FOREIGN PATENT DOCUMENTS

| | | | |
|---|---|---|---|
| KR | 10-2012-0080923 A | 7/2012 |
| KR | 10-1365281 B1 | 2/2014 |
| KR | 10-2019-0064877 A | 6/2019 |
| WO | 2013/099286 A1 | 7/2013 |
| WO | 2013/190859 A1 | 12/2013 |

OTHER PUBLICATIONS

Search Report (PCT/ISA/210) issued Jun. 10, 2021 by the International Searching Authority for International Application No. PCT/KR2021/002283.

Written Opinion (PCT/ISA/237) issued Jun. 10, 2021 by the International Searching Authority for International Application No. PCT/KR2021/002283.

Communication issued Dec. 30, 2024 from the Korean Intellectual Property Office for Korean Patent Application No. 10-2020-0033497.

Communication issued Feb. 19, 2025 from the China National Intellectual Property Administration for Chinese Patent Application No. 202180022341.7.

Second Office Action issued on Aug. 20, 2025 by the Chinese Patent Office in corresponding CN Patent Application No. 202180022341.7.

* cited by examiner

PRINTED CIRCUIT BOARD COMPRISING GROUND WIRE

CROSS-REFERENCE TO THE RELATED APPLICATIONS

This application is a bypass continuation of International Application No. PCT/KR2021/002283, filed on Feb. 24, 2021, in the Korean Intellectual Property Office, which claims priority to Korean Patent Application No. 10-2020-0033497, filed on Mar. 18, 2020, in the Korean Intellectual Property Office, the contents of which are incorporated by reference in their entireties.

BACKGROUND

1. Technical Field

Various embodiments of the present disclosure relate to a printed circuit board including a ground wire.

2. Background Art

To meet the demand for increased wireless data traffic since deployment of 4th-generation (4G) communication systems, efforts have been made to develop an improved 5th-generation (5G) or pre-5G communication system. Therefore, the 5G or pre-5G communication system is also called a "beyond 4G network" communication system or a "post LTE" system.

The 5G communication system is considered to be implemented in mmWave bands (e.g., 60 GHz bands) so as to accomplish higher data rates. To decrease propagation loss of the radio waves and increase the transmission distance in the ultrahigh frequency bands, beamforming, massive multiple-input multiple-output (massive MIMO), full dimensional MIMO (FD-MIMO), array antenna, analog beam forming, and large scale antenna techniques are discussed in 5G communication systems.

In addition, in 5G communication systems, development for system network improvement is under way based on advanced small cells, cloud radio access networks (cloud RANs), ultra-dense networks, device-to-device (D2D) communication, wireless backhaul, moving network, cooperative communication, coordinated multi-points (CoMP), reception-end interference cancellation, and the like.

In the 5G system, hybrid FSK and QAM modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have also been developed.

SUMMARY

In order to provide a compact product, a printed circuit substrate (e.g., printed circuit board (PCB), flexible PCB (FPCB)) may be used to connect an antenna and a communication module (e.g., 5G, WiFi, or the like), or used for a high-speed interface. In connection with the printed circuit board of an electronic device, the ground in an area adjacent to a via pad may be removed to prevent signal congestion. However, when the electronic device is used in a super-high-frequency band, impedance mismatching may occur in an opening area having no ground formed therein, thereby causing radio frequency loss.

Various embodiments of the present disclosure may provide a printed circuit board capable of reducing impedance mismatching that may occur in an opening area formed on a ground having a via pad positioned thereon.

Problems to be solved by embodiments of the present disclosure are not limited to the above-mentioned problems, and may be variously expanded without deviating from the scope of the present disclosure.

According to various embodiments of the present disclosure, a printed circuit board is provided. The printed circuit board includes: a first layer including a first ground including a first opening, wherein at least one first ground wire is within the first opening; a second layer disposed in a direction from the first layer and including a second ground including a second opening, wherein the second opening at least partially overlaps with the first opening and wherein at least one second ground wire is within the second opening; a third layer between the first layer and the second layer and including a third opening, wherein the third opening at least partially overlaps with the first opening and wherein a first via pad is within the third opening; a fourth layer between the second layer and the third layer and including a fourth opening, wherein the fourth opening at least partially overlaps with the third opening and wherein a second via pad is within the fourth opening; and a via at least partially surrounded by the first via pad and the second via pad.

A printed circuit board according to various embodiments of the present disclosure may reduce loss of super-high-frequency signals by a ground wire configured to form a capacitive coupling with a via pad.

A printed circuit board according to various embodiments of the present disclosure may provide impedance matching by using a ground wire formed near a via.

DETAILED DESCRIPTION

Figure 1:
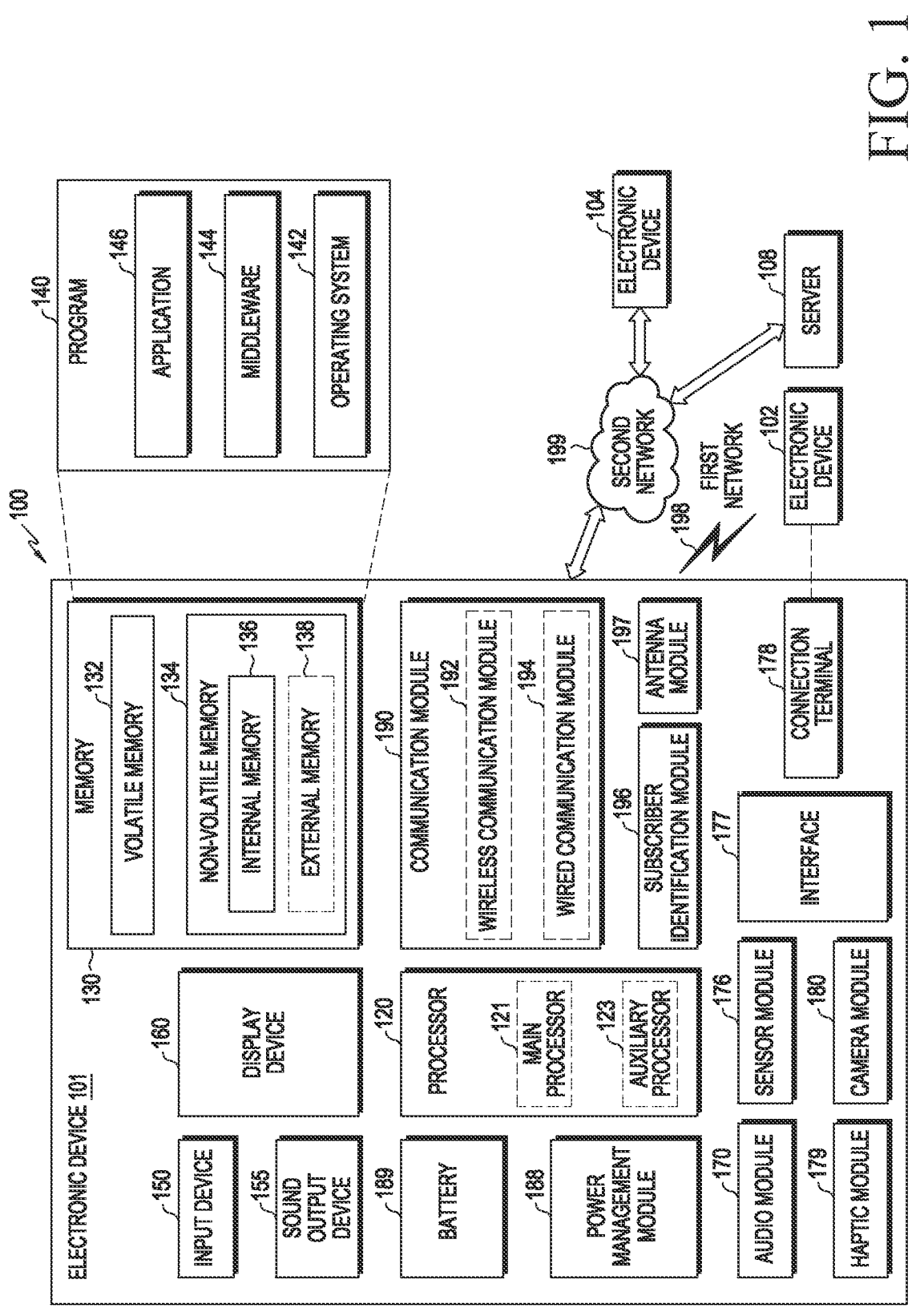
FIG. 1 is a block diagram of an electronic device in a network environment according to various embodiments of the present disclosure.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by a component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image and moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and support a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to (based on) a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
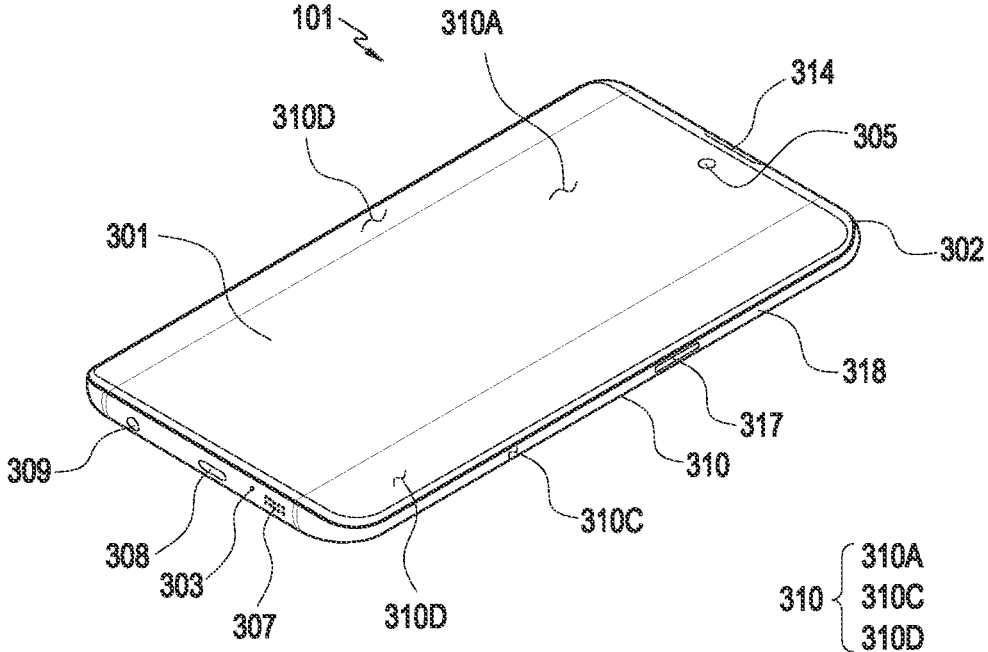
FIG. 2 is a front perspective view of an electronic device according to various embodiments of the present disclosure.
Figure 3:
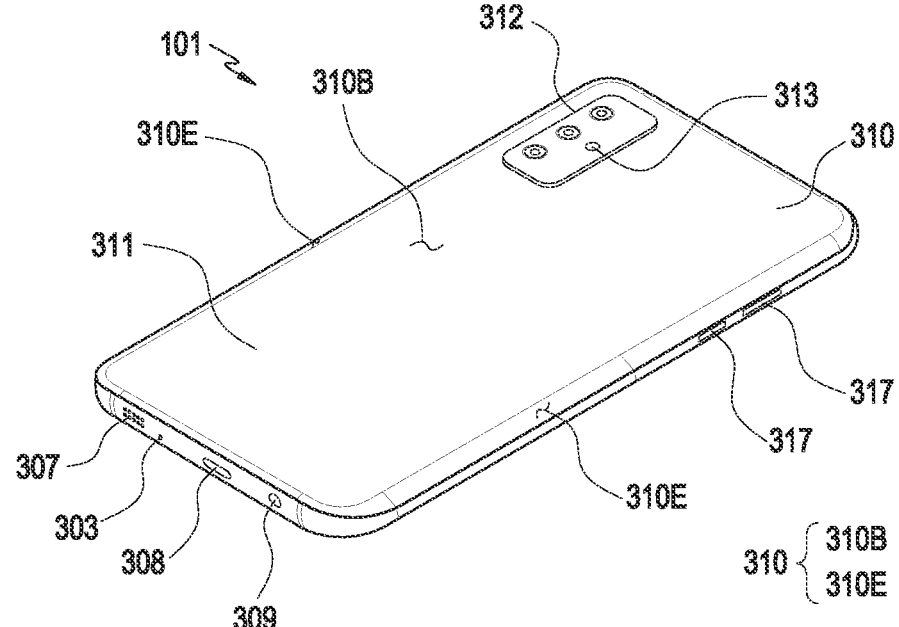
FIG. 3 is a rear perspective view of an electronic device according to various embodiments of the present disclosure.

FIG. 2 is a front perspective view of an electronic device 101 according to various embodiments of the present disclosure. FIG. 3 is a rear perspective view of an electronic device 101 according to various embodiments of the present disclosure.

Referring to FIG. 2 and FIG. 3, an electronic device 101 according to an embodiment may include a housing 310 including a front surface 310A, a rear surface 310B, and a side surface (e.g., the side surface 310C in FIG. 2 and FIG. 3) surrounding a space between the front surface 310A and the rear surface 310B. According to another embodiment, the housing 310 may be referred to as a structure which forms a part of a first surface (e.g., the front surface 310A in FIG. 2), a second surface (e.g., the rear surface 310B in FIG. 3), and the side surface 310C, which are illustrated in FIG. 2.

According to an embodiment, the front surface 310A may be formed of a front plate 302 (e.g., a glass plate including various coating layers, or a polymer plate) of which at least a portion is substantially transparent. The rear surface 310B may be formed of a rear plate 311. For example, the rear plate 311 may be formed of coated or colored glass, ceramic, polymer, metal (e.g., aluminum, stainless steel (STS), or magnesium), or a combination of at least two of the above materials. The side surface 310C may be coupled to the front plate 302 and the rear plate 311, and may be formed of a side bezel structure (or "a side member") 318 including metal and/or polymer. In some embodiments, the rear plate 311 and the side bezel structure 318 may be integrally formed, and may include the same material (e.g., ceramic).

In the illustrated embodiment, the front plate 302 may include two first edge areas 310D which are bent from the front surface 310A toward the rear plate 311 so as to extend seamlessly and provided at opposite long edge ends of the front plate 302. In the illustrated embodiment (see FIG. 3), the rear plate 311 may include two second edge areas 310E which are bent from the rear surface 310B toward the front plate 302 so as to extend seamlessly and provided at opposite long ends thereof. In some embodiments, the front plate 302 (or the rear plate 311) may include only one of the first edge areas 310D (or the second edge areas 310E). In another embodiment, a part of the first edge areas 310D or the second edge areas 310E may not be included therein. In the embodiments, when seen from the side surface of the electronic device 101, the side bezel structure 318 may have a first thickness (or width) in the side-surface side not including the first edge areas 310D or the second edge areas 310E, and may have a second thickness thinner than the first thickness, in the side-surface side including the first edge areas 310D or the second edge areas 310E.

According to an embodiment, the electronic device 101 may include at least one of a display 301, audio modules (e.g., a microphone hole 303, an external speaker hole 307, and a receiver hole 314, as the audio module 170 in FIG. 1), a sensor module (e.g., the sensor module 176 in FIG. 1), camera modules (e.g., a first camera module 305 and a second camera module 312), a key input device 317 (e.g., the input device 150 in FIG. 1), and connector holes (e.g., a first connector hole 308 and a second connector hole 309, as the connection terminal 178 in FIG. 1). In some embodiments, at least one (e.g., the key input device 317 or the first connector hole 308) of elements of the electronic device 101 may be omitted, and the electronic device 101 may additionally include other elements.

According to an embodiment, for example, the display 301 may be exposed through a significant portion of the front plate 302. In some embodiments, at least a part of the display 301 may be exposed through the front surface 310A and the front plate 302 forming the first edge areas 310D of the side surface 310C. In some embodiments, the corners of the display 301 may be formed to have a shape substantially the same as the outer shape of the front plate 302 adjacent thereto. In another embodiment, in order to expand an area which allows the display 301 to be exposed, the gap between the outer perimeter of the display 301 and the outer perimeter of the front plate 302 may be formed to be substantially the same.

In an embodiment, a surface (or the front plate 302) of the housing 310 may include a screen display area formed as the display 301 that is visually exposed. As an example, the screen display area may include the front surface 310A and the first edge areas 310D of the side surface.

In another embodiment, a recess or an opening may be formed in a part of a screen display area (e.g., the front surface 310A or the first edge areas 310D) of the display 301, and at least one of the receiver hole 314, a sensor module (not shown), a light-emitting element (not shown), and the first camera module 305, which is aligned with the recess or the opening, may be included therein. In another embodiment (not shown), at least one of the receiver hole 314, a sensor module (not shown), the first camera module 305, and a light-emitting element (not shown) may be included on the rear surface of the screen display area of the display 301.

In another embodiment, the display 301 may be coupled to or disposed adjacent to a touch detection circuit, a pressure sensor capable of measuring the intensity (pressure) of touch, and/or a digitizer for detecting a magnetic field-type stylus pen.

In some embodiments, at least a part of the key input device 317 may be disposed in the first edge areas 310D and/or the second edge areas 310E.

According to an embodiment, for example, the audio module may include a microphone hole 303 and speaker holes. The microphone hole 303 may have a microphone for obtaining external sound disposed therein, and in some embodiments, multiple microphones may be arranged to be able to detect the direction of sound. The speaker holes may include an external speaker hole 307 and a receiver hole 314 for phone calls. In some embodiments, the speaker holes and the microphone hole 303 may be implemented as one hole, or a speaker (e.g., a piezo speaker) may be included therein without the speaker holes.

According to an embodiment, for example, a sensor module (not shown) may be configured to generate an electrical signal or a data value corresponding to an internal operation state of the electronic device 101 or an external environmental state. For example, the sensor module (not shown) may include a first sensor module (not shown) (e.g., a proximity sensor) and/or a second sensor module (not shown) (e.g., a fingerprint sensor) disposed on the front surface 310A of the housing 310, and/or a third sensor module (not shown) (e.g., an HRM sensor) and/or a fourth sensor module (not shown) (e.g., a fingerprint sensor) disposed on the rear surface 310B of the housing 310. In some embodiments, the fingerprint sensor may be disposed on the rear surface 310B as well as the front surface 310A (e.g., the display 301) of the housing 310. The electronic device 101 may further include a sensor module, for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illuminance sensor (not shown).

According to an embodiment, for example, the camera modules may include a first camera module 305 disposed on the front surface 310A of the electronic device 101, and a second camera module 312 and/or a flash 313 disposed on the rear surface 310B. The first camera module 305 and the second camera module 312 each may include one lens or multiple lenses, an image sensor, and/or an image signal processor. For example, the flash 313 may include a light-emitting diode or a xenon lamp. In some embodiments, two or more lenses (e.g., an infrared camera, a wide-angle lens, and a telephoto lens) and image sensors may be arranged on one surface of the electronic device 101.

According to an embodiment, the key input device 317 may be disposed on the side surface 310C of the housing 310. In another embodiment, the electronic device 101 may not include a part or the whole of key input device 317 mentioned above, and the key input device 317 not included therein may be implemented as a different type such as a soft key, on the display 301.

According to an embodiment, for example, a light-emitting element (not shown) may be disposed on the front surface 310A of the housing 310. For example, the light-emitting (not shown) may be configured to provide state information of the electronic device 101 in the form of light. In another embodiment, for example, the light-emitting element (not shown) may provide a light source interlocked with an operation of the first camera module 305. For example, the light-emitting element (not shown) may include an LED, an IR LED, and/or a xenon lamp.

According to an embodiment, for example, the connector holes may include a first connector hole 308 capable of accommodating a connector (e.g., a USB connector) for transmitting or receiving power and/or data to or from an external electronic device, and/or a second connector hole 309 (e.g., an earphone jack) capable of accommodating a connector for transmitting or receiving audio signals to or from an external electronic device.

Figure 4:
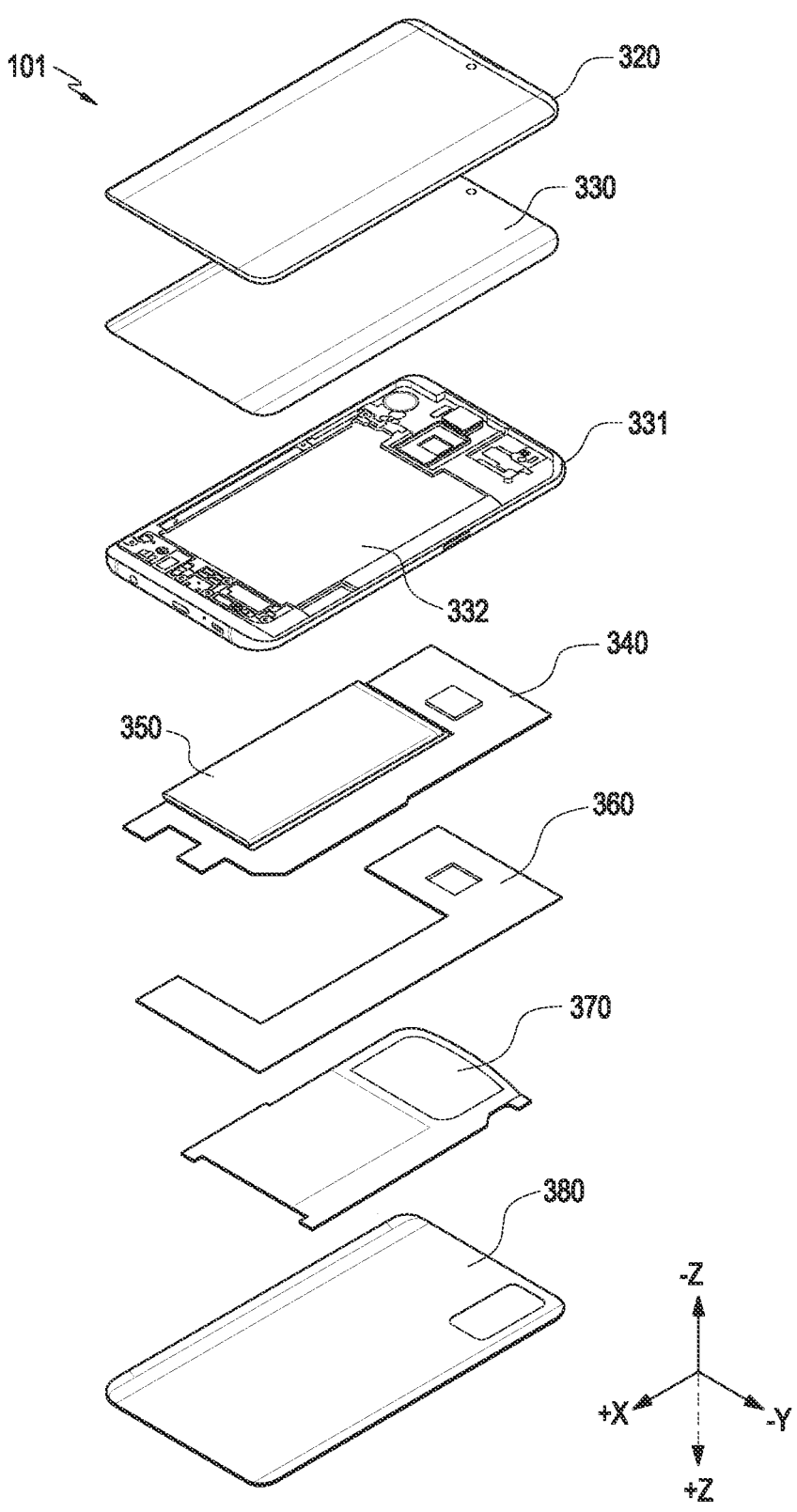
FIG. 4 is an exploded perspective view of an electronic device according to various embodiments of the present disclosure.
Figure 5:
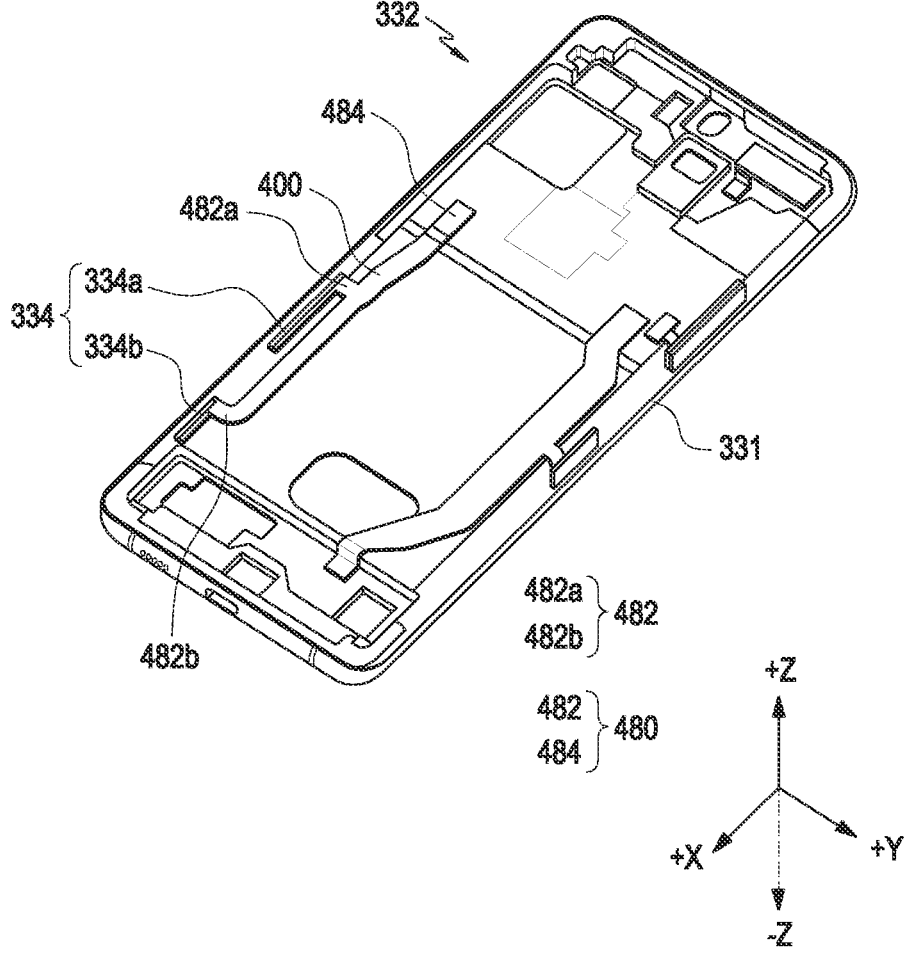
FIG. 5 is a rear perspective view of a first support member according to various embodiments of the present disclosure.

FIG. 4 is an exploded perspective view of an electronic device 101 according to various embodiments of the present disclosure. FIG. 5 is a rear perspective view of the first support member 332 in FIG. 4.

Referring to FIG. 4 and FIG. 5, an electronic device 101 (e.g., the electronic device 101 in FIG. 2 and FIG. 3) may include a front plate 320 (e.g., the front plate 302 in FIG. 2), a display 330 (e.g., the display 301 in FIG. 2), a first support member 332 (e.g., a bracket), a main printed circuit board 340 (e.g., a PCB), a printed circuit board 400 (e.g., an FPCB), a battery 350, a second support member 360 (e.g., a rear case), a first antenna 334, a second antenna 370, and a rear plate 380 (e.g., the rear plate 311 in FIG. 3). In some embodiments, at least one (e.g., the first support member 332 or the second support member 360) of elements of the electronic device 101 may be omitted, or other elements may be additionally included therein. At least one of elements of the electronic device 101 may be the same as or similar to at least one of elements of the electronic device 101 in FIG. 2 or FIG. 3, and overlapping descriptions will be omitted hereinafter.

According to an embodiment, for example, the first support member 332 may be disposed inside the electronic device 101 to be connected to a side bezel structure 331 (e.g., the side bezel structure 318 in FIG. 2) or to be formed integrally with the side bezel structure 331. For example, the first support member 332 may be formed of a metal material and/or a non-metal (e.g., polymer) material. The first support member 332 may have one surface to which the display 330 is coupled, and another surface to which the main printed circuit board 340 is coupled.

According to various embodiments, an antenna structure may be formed of a part of the side bezel structure 331 and/or the first support member 332, or a combination thereof. For example, the first antenna 334 may be formed of a part of the side bezel structure 331 and/or the first support member 332, or a combination thereof. The first antenna 334 may be positioned in at least a part of a space formed by a part of the side bezel structure 331 and/or the first support member 332 or a combination thereof. According to an embodiment, the first antenna 334 may include at least one radiation conductor, and may receive feeding provided from a communication module (e.g., the communication module 190 in FIG. 1) disposed on the main printed circuit board 340 so as to communicate a wireless signal. Here, the communication may mean at least one of transmission, reception, or transmission/reception of a wireless signal. According to an embodiment, the first antenna 334 may be an antenna configured to transmit or receive a wireless signal in a frequency band of several tens GHz or more. For example, the first antenna 334 may be an antenna for millimeter-wave communication. According to various embodiments, the first antenna 334 may include multiple antennas for communicating in multiple frequency bands different from each other. For example, the first antenna 334 may include a (1-1)th antenna 334a for communicating in a first frequency band (e.g., 10 GHz) and a (1-2)th antenna 334b for communicating in a second frequency band (e.g., 18 GHz). The configuration of the first antenna 334 in FIG.

5 may be entirely or partially the same as the configuration of the antenna module 197 in FIG. 1.

According to an embodiment, for example, the main printed circuit board 340 may have a processor, a memory, and/or an interface mounted thereon. For example, the processor may include one or more of a central processing device, an application processor, a graphic processing device, an image signal processor, a sensor hub processor, and a communication processor.

According to an embodiment, the memory may include a volatile memory or a non-volatile memory.

According to an embodiment, for example, the interface may include a high-definition multimedia interface (HDMI), a universal serial bus (USB) interface, an SD card interface, and/or an audio interface. For example, the interface may electrically or physically connect the electronic device 101 to an external electronic device, and may include a USB connector, an SD card/MMC connector, or an audio connector.

According to an embodiment, the battery 350 may be a device configured to supply power to at least one element of the electronic device 101, and for example, may include a non-rechargeable primary cell, a rechargeable secondary cell, or a fuel cell. For example, at least a part of the battery 350 may be disposed on substantially the same plane as the main printed circuit board 340. The battery 350 may be integrally disposed inside the electronic device 101, or may be disposed to be detachable/attachable from/to the electronic device 101.

According to an embodiment, the second support member 360 (e.g., a rear case) may be disposed between the main printed circuit board 340 and the second antenna 370. According to an embodiment, the second support member 360 may include one surface to which at least one of the main printed circuit board 340 and the battery 350 is coupled, and another surface to which the second antenna 370 is coupled.

According to an embodiment, the second antenna 370 may be disposed between the rear plate 380 and the battery 350. For example, the second antenna 370 may include a near field communication (NFC) antenna, a wireless charging antenna, and/or a magnetic secure transmission (MST) antenna. For example, the second antenna 370 may perform a short-range communication with an external device, or may transmit or receive power for wireless charging. The rear plate 380 may form at least a part of the rear surface (e.g., the rear surface 310B in FIG. 3) of the electronic device 101. The configuration of the second antenna 370 in FIG. 5 may be entirely or partially the same as the configuration of the antenna module 197 in FIG. 1.

According to an embodiment, the printed circuit board 400 may electrically connect the first antenna 334 and the main printed circuit board 340. For example, the printed circuit board 400 may be a flexible printed circuit board type radio frequency cable (FRC). According to an embodiment, the printed circuit board 400 may be disposed in at least a part of the first support member 332. For example, the printed circuit board 400 may be disposed in at least a part of the other surface of the first support member 332 oriented in a second direction (the −Z-direction).

According to various embodiments, the printed circuit board 400 may be electrically connected to the first antenna 334 and a communication module (e.g., the communication module 190 in FIG. 1) through a connection member 480. For example, the connection member 480 may include a first connection member 482 for connection with the first antenna 334, and a second connection member 484 for connection with a communication module (e.g., the communication module 190 in FIG. 1). According to an embodiment, the first connection member 482 may be connected to a plurality of the first antenna 334. For example, the first connection member 482 may include a (1-1)th connection member 482a connected to the (1-1)th antenna 334a, and a (1-2)th connection member 482b connected to the (1-2)th antenna 334b.

Figure 6:
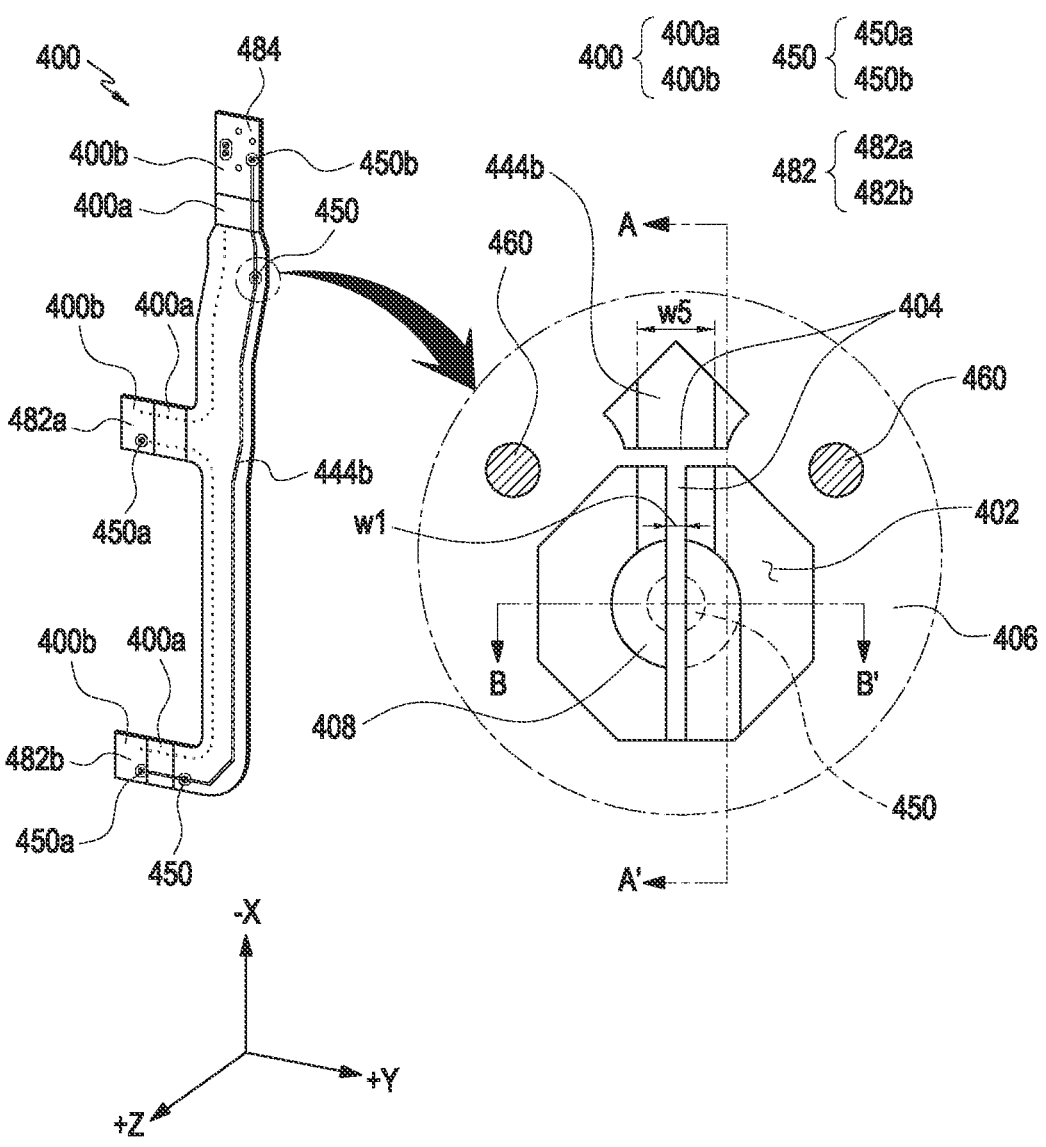
FIG. 6 is a perspective view of a printed circuit board according to various embodiments of the present disclosure.

FIG. 6 is a perspective view of a printed circuit board according to various embodiments of the present disclosure.

According to FIG. 6, a printed circuit board 400 may include a ground wire 404, a ground 406, a via pad 408, and a via 450. The configuration of the printed circuit board 400 in FIG. 6 may be entirely or partially the same as the configuration of the printed circuit board 400 in FIG. 5.

According to various embodiments, the ground 406 may provide a reference potential to an electronic component (e.g., the first antenna 334 in FIG. 5) of an electronic device (e.g., the electronic device 101 in FIG. 1). For example, the ground 406 may form a capacitive coupling with the via pad 408 of the printed circuit board 400. For example, the ground 406 may include a first ground (e.g., the first ground 416 in FIG. 7) and a second ground (e.g., the second ground 426 in FIG. 7) described below.

Figure 7:
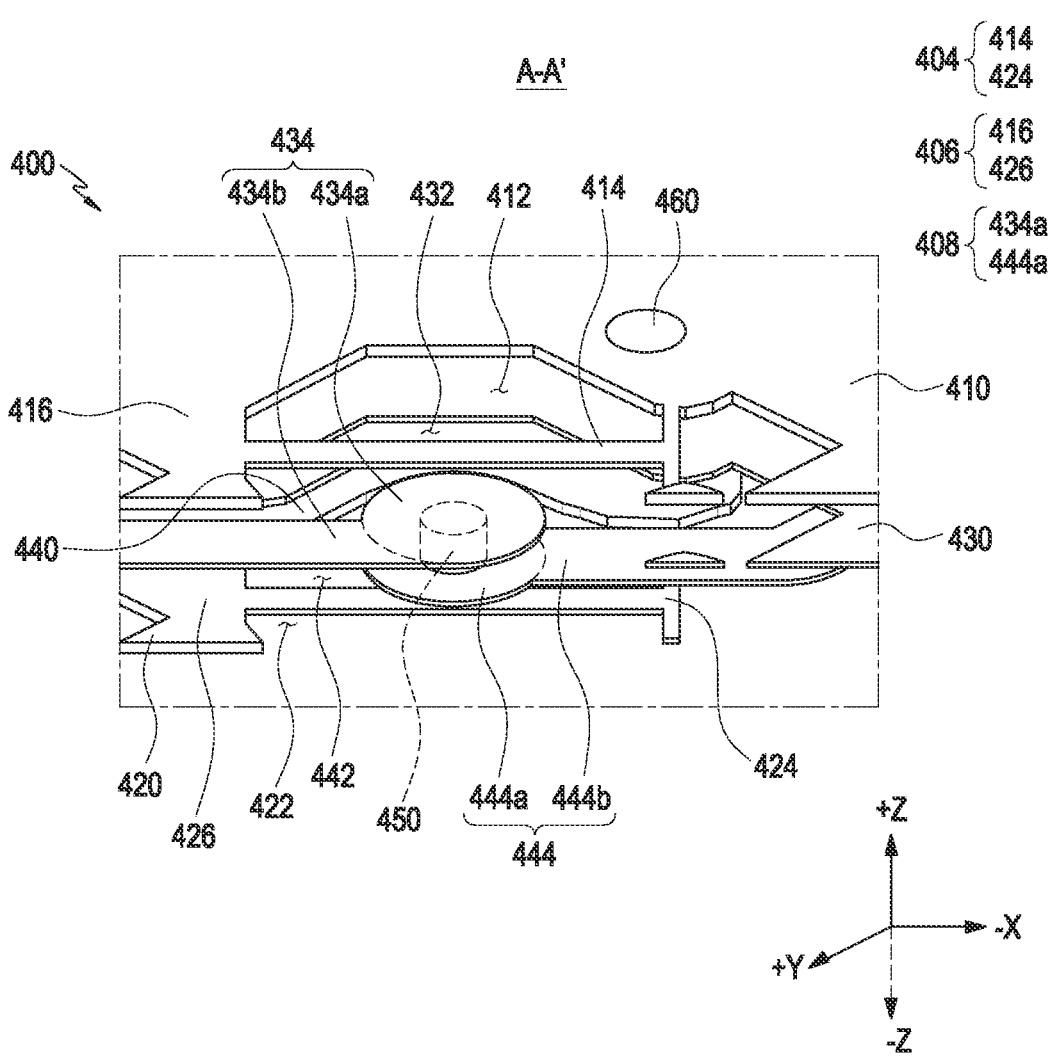
FIG. 7 is a cross-sectional perspective view showing a surface taken along line A-A' in FIG. 6.

According to various embodiments, the via 450 may electrically connect wire lines (e.g., the first wire line 434b and the second wire line 444b in FIG. 7) of the printed circuit board 400, which are formed on different layers. For example, the inside of the via 450 may be filled with an electric conductor, and the wire lines may be electrically connected through the electric conductor and the via pad 408 inside the via 450.

According to various embodiments, the via pad 408 may be formed in a shape surrounding at least a part of the via 450. For example, the via pad may be formed in a shape (e.g., a circle) substantially similar to the shape of the via 450 so as to surround the via 450, and may be formed to have various shapes (e.g., ellipse, polygon, etc.) other than the illustrated shape.

According to various embodiments, the via pad 408 may surround at least a part of the via 450. According to an embodiment, the via 450 may extend through the via pad 408. For example, the via pad 408 may surround at least a part of the side surface (e.g., the XY plane) of the via 450. According to another embodiment, the via 450 may be disposed between a plurality of the via pad 408. For example, the via 450 may be disposed between a first via pad 434a and a second via pad 444a.

According to various embodiments, the printed circuit board 400 may include a first substrate 400a and a second substrate 400b connected to the first substrate 400a. At least one of the first substrate 400a and the second substrate 400b may be formed of a flexible printed circuit board. According to an embodiment, the second substrate 400b may include more layers than layers of the first substrate 400a. For example, the second substrate 400b may include four conductive layers, and the first substrate 400a may include two conductive layers. As the numbers of layers of the first substrate 400a and the second substrate 400b are changed, the impedance of the printed circuit board 400 may be changed in an area in which the via pad 408 and the via 450, which are connected to a wire of the first substrate 400a and a wire of the second substrate 400b, are positioned.

According to various embodiments, the printed circuit board 400 may include an opening 402 formed in the ground 406 in a position corresponding to the via pad 408. For example, when the printed circuit board 400 is seen in the second direction (the −Z-direction), at least a part of the opening 402 may be formed to overlap the via pad 408. Therefore, crosstalk of signals passing around the ground 406, in which the opening 402 is formed, may be reduced. For example, the opening 402 may reduce the area in which the via pad 408 and the ground 406 directly face so that jamming between the via pad 408 and the ground 406 is reduced.

According to various embodiments, the printed circuit board 400 may include the ground wire 404 positioned in the opening 402. For example, the ground wire 404 may be disposed on the printed circuit board 400 while crossing the opening 402. According to an embodiment, the ground wire 404 may form a capacitive coupling with at least one of inner layers of the printed circuit board 400. For example, the ground wire 404 may form a capacitive coupling with the via pad 408. By the capacitance formed between the ground wire 404 and the via pad 408, the printed circuit board 400 may be formed to have a characteristic impedance $Z_0$ having a preset value (e.g., about 50Ω).

According to various embodiments, a fifth width w5, which is the width of the second wire line 444b, may be greater than a first width w1 which is the width of the ground wire 404. For example, the fifth width w5 may be formed as large as a designated ratio (e.g., four times to five times) with respect to the first width w1 and/or a second width (e.g., the second width w2 in FIG. 8). For example, the first width w1 may be formed to be about 45 μm, and the fifth width w5 may be formed to be about 200 μm.

According to various embodiments, the characteristic impedance may be formed based on a capacity C. According to an embodiment, the characteristic impedance $Z_0$ may be expressed as Equation 1, as shown below. In Equation 1, R may represent resistance, L may represent an inductance, G may represent conductance, and C may represent a capacity.

$$ZO = \sqrt{\frac{R + jwL}{G + jwC}} \qquad \text{[Equation 1]}$$

According to various embodiments, the capacity C may be formed based on an area (e.g., the area A of Equation 2 as shown below) in which the via pad 408 and the ground wire 404 overlap each other and the distance (e.g., the distance d of Equation 2) between the via pad 408 and the ground wire 404. An area A, in which the via pad 408 and the ground wire 404 overlap each other, may be formed based on the first width w1, which is the width of the ground wire 404, and a fourth width (e.g., the fourth width w4 in FIG. 8), and a distance d between the via pad 408 and the ground wire 404 may be formed based on at least one of a first thickness (e.g., the first thickness t1 in FIG. 8) or a third thickness (e.g., the third thickness t3 in FIG. 8). According to an embodiment, the capacity C may be expressed as Equation 2 as shown below. In Equation 2, ε0 may represent a dielectric constant of a material (e.g., the insulating layer 470 in FIG. 8) positioned between the via pad 408 and the ground wire 404.

$$C = \varepsilon 0 \frac{A}{d} \qquad \text{[Equation 2]}$$

According to various embodiments, when the ground wire 404 is seen in a first direction (the +Z-direction) or the second direction (the −Z), the ground wire 404 may at least partially overlap the via pad 408 and/or a wire line (e.g., the first wire line 434b and the second wire line 444b in FIG. 7). In addition, the ground wire 404 is not limited to the illustrated example, and may be formed in various shapes.

According to an embodiment, the via 450 may be disposed at various positions of the printed circuit board 400. According to an embodiment, the via 450 may be disposed at a position of the printed circuit board 400, which is adjacent to the connection member 480. For example, the via 450 may be electrically connected to at least one of the first connection member 482 and the second connection member 484. A plurality of the via 450 may be provided and may include a first via 450a connected to the first connection member 482 and a second via 450b connected to the second connection member 484. According to another embodiment, the via 450 may be disposed on the second substrate 400b adjacent to the first substrate 400a. For example, the via 450 may include a first via pad (e.g., the first via pad 434a in FIG. 7) and a second via pad (e.g., the second via pad 444a in FIG. 7) which are electrically connected to the first substrate 400a and the second substrate 400b, respectively. The ground wire 404 may be disposed to correspond to the via pad 408 and the via 450 so as to convert the impedance of the via pad 408 and the via 450 into a preset impedance. According to various embodiments, the via pad 408 may be positioned in at least a part of the opening 402.

According to various embodiments, the printed circuit board 400 may include a ground via 460. The ground via 460 may be connected to the ground 406 and thus may stably maintain the potential of the printed circuit board 400. For example, the ground via 460 may be formed to extend through at least a part of the ground 406.

Figure 8:
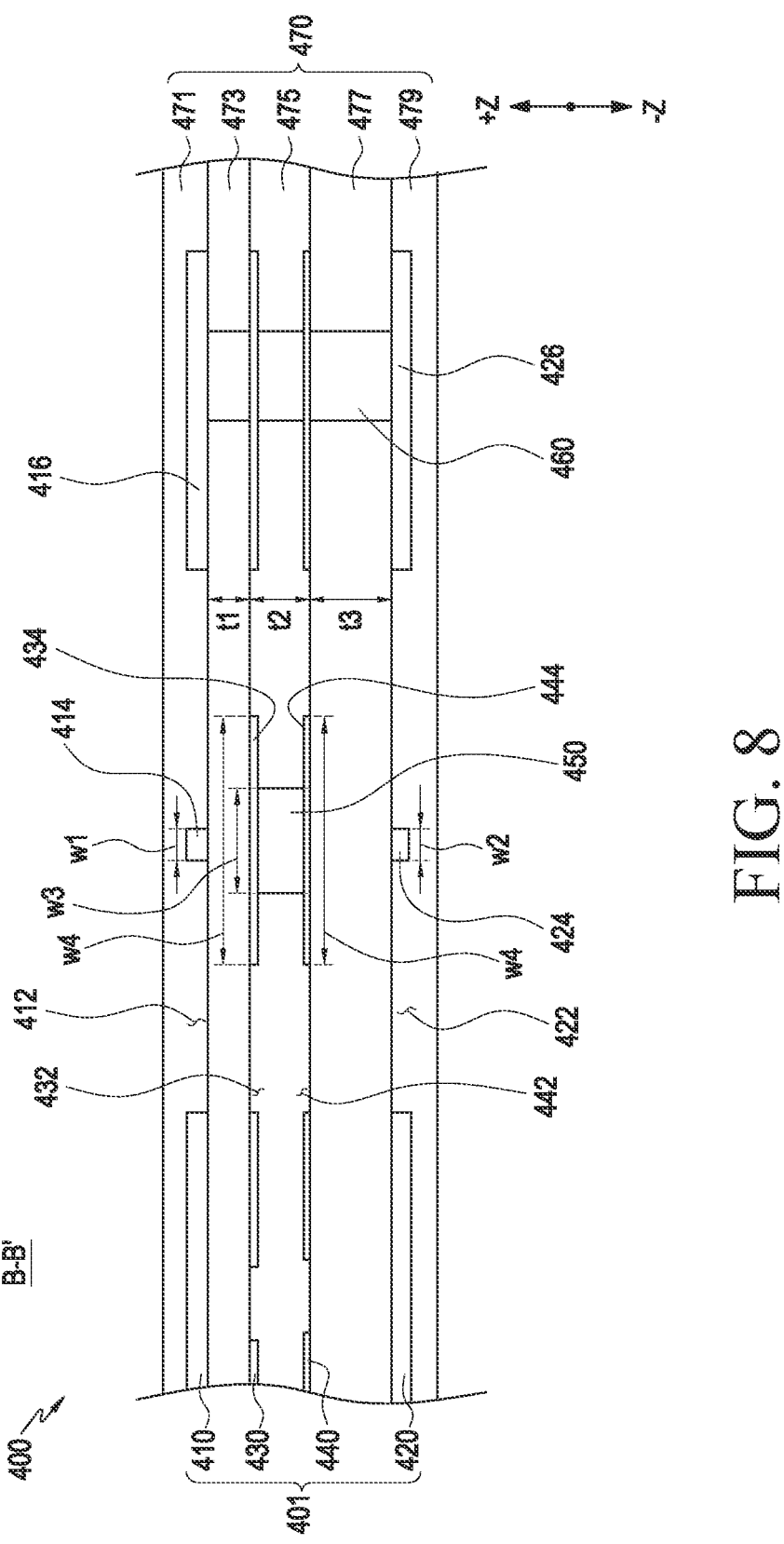
FIG. 8 is a cross-sectional view showing a surface taken along line B-B' in FIG. 6.

FIG. 7 is a cross-sectional perspective view showing a surface taken along line A-A' in FIG. 6. FIG. 8 is a cross-sectional view showing a surface taken along line B-B' in FIG. 6.

According to FIG. 7 and FIG. 8, the printed circuit board 400 may include multiple conductive layers 401. For example, the printed circuit board 400 may include a first layer 410 oriented in the first direction (the +Z-direction), a second layer 420 oriented in the second direction (the −Z-direction) opposite the first direction (the +Z-direction), and multiple conductive layers disposed between the first layer 410 and the second layer 420. For example, the printed circuit board 400 may further include a third layer 430 disposed between the first layer 410 and the second layer 420, and a fourth layer 440 disposed between the third layer 430 and the second layer 420.

According to an embodiment, the first layer 410 and/or the second layer 420 may be formed to be thicker than the third layer 430 and/or the fourth layer 440. For example, the first layer 410 and/or the second layer 420 may be formed to have a thickness of about 20 μm, and the third layer 430 and/or the fourth layer 440 may be formed to have a thickness of about 6 μm.

In the present disclosure, for the convenience of explanation, although a printed circuit board formed of four layers is described, the printed circuit board including a ground wire described in the present disclosure may also be applied to a printed circuit board having four or more layers, for example, a printed circuit board formed of six layers or eight layers. The configurations of the printed circuit board 400 in FIG. 7 and FIG. 8 may be entirely or partially the same as the configurations of the printed circuit board 400 in FIG. 5 and FIG. 6.

According to various embodiments, the thicknesses of the conductive layers 401 may be variously formed. For example, the thickness of the first layer 410 and the second layer 420, which are exposed to the outside of the printed circuit board 400, may be thicker than the thickness of the inner layers (e.g., the third layer 430 or the fourth layer 440) of the printed circuit board 400.

According to various embodiments, the first layer 410 may include a first ground 416, and the second layer 420 may include a second ground 426. The configurations of the first ground 416 and the second ground 426 in FIG. 7 may be entirely or partially the same as the configurations of the ground 406 in FIG. 6. According to an embodiment, the first ground 416 may form a capacitive coupling with the third layer 430 disposed under (e.g., the −Z-direction) the first layer 410, and the second ground 426 may form a capacitive coupling with the fourth layer 440. Therefore, crosstalk of signals of the printed circuit board 400 may be reduced by the first ground 416 and the second ground 426. The configurations of the first ground 416 and the second ground 426 may be entirely or partially the same as the configuration of the ground 406 in FIG. 6.

According to various embodiments, the first layer 410 may include a first opening 412, and the second layer 420 may include a second opening 422. The configuration of the first opening 412 and/or the second opening 422 may be entirely or partially the same as the configuration of the opening 402 in FIG. 6. According to various embodiments, only at least one of the first opening 412 and/or the second opening 422 may be formed in the printed circuit board 400. For example, the first layer 410 may include the first opening 412, and the second layer 420 may not include the second opening 422.

According to various embodiments, the first opening 412 may be a hole extending through a position of the first ground 416, which corresponds to the via pad 408. According to an embodiment, the first ground 416, in which the first opening 412 is formed, may reduce crosstalk of signals. For example, the first opening 412 may be formed in the first ground 416 corresponding to the via pad 408, and thus the area, in which the first ground 416 in which the first opening 412 is formed and the first via pad 434a face each other, may be reduced. Therefore, disturbance of signals passing through the via pad 408 may be reduced.

According to various embodiments, the second opening 422 may be a hole extending through a position of the second ground 426, which corresponds to the via pad 408. According to an embodiment, the second ground 426, in which the second opening 422 is formed, may reduce crosstalk of signals. For example, the second opening 422 may be formed in the second ground 426 corresponding to the via pad 408, and thus the area, in which the second ground 426 in which the second opening 422 is formed and the second via pad 444a face each other, may be reduced. Therefore, disturbance of signals passing through the via pad 408 may be reduced. According to an embodiment, at least a part of the second opening 422 may be formed to correspond to at least a part of the first opening 412.

According to various embodiments, the printed circuit board 400 may include a first conductive member 434 and/or a second conductive member 444 positioned on at least one of the conductive layers 401. For example, the first conductive member 434 may include a first via pad 434a and a first wire line 434b, and for example, the second conductive member 444 may include a second via pad 444a and a second wire line 444b.

According to various embodiments, the first conductive member 434 may be disposed on the third layer 430, and the second conductive member 444 may be disposed on the fourth layer 440. The first conductive member 434 and the second conductive member 444 may be electrically connected through the via 450.

According to various embodiments, the printed circuit board 400 may include a ground wire 404. The ground wire 404 may be disposed on a plane (e.g., the XY plane) which is substantially the same as the first layer 410 or the second layer 420. For example, the ground wire 404 may be positioned in at least one of the first opening 412 of the first layer 410 or the second opening 422 of the second layer 420. According to an embodiment, the first layer 410 may include a first ground wire 414. The first ground wire 414 may form a capacitive coupling with at least one (e.g., the third layer 430 or the fourth layer 440) of inner layers of the printed circuit board 400. For example, the first ground wire 414 may form a capacitive coupling with at least one of the first via pad 434a and the second via pad 444a. According to an embodiment, the second layer 420 may include a second ground wire 424. The second ground wire 424 may form a capacitive coupling with at least one (e.g., the third layer 430 or the fourth layer 440) of inner layers of the printed circuit board 400. According to an embodiment, the first ground wire 414 and the second ground wire 424 may be positioned to correspond to each other. According to various embodiments, the first ground wire 414 and the second ground wire 424 are not limited to the illustrated embodiment, and may be formed in various shapes (e.g., forms or thicknesses, etc.). For example, each of the first ground wire 414 and the second ground wire 424 may be formed in plural, and the multiple ground wires may be variously arranged.

According to various embodiments, at least one of the first ground wire 414 and the second ground wire 424 may have at least a part positioned to correspond to the via 450. For example, when the printed circuit board 400 is seen from the above (the +Z-direction) (e.g., when the printed circuit board is seen in the second direction (−Z)), at least a part of the first ground wire 414 or the second ground wire 424 may overlap at least a part of the via 450.

According to various embodiments, the printed circuit board 400 may include at least one of the first ground wire 414 and/or the second ground wire 424. For example, the printed circuit board 400 may include the first layer 410 including the first ground 416 having the first opening 412 formed therethrough in which the first ground wire 414 is disposed, and the second layer 420 including a second ground 426. According to another embodiment, the second ground 426 may not include an opening corresponding to the first opening 412 and/or a ground wire corresponding to the first ground wire 414.

According to various embodiments, the third layer 430 may include a third opening 432, and the fourth layer 440 may include a fourth opening 442. The third opening 432 and/or the fourth opening 442 may be disposed to correspond to at least a part of the first opening 412 or the second opening 422. For example, when the printed circuit board 400 is seen from the above (the +Z-direction), the first opening 412, the second opening 422, the third opening 432, and the fourth opening 442 may at least partially overlap each other.

According to various embodiments, the printed circuit board 400 may include a third layer 430 including a first via pad 434a and a fourth layer 440 including a second via pad 444a. According to an embodiment, the first via pad 434a may be positioned in at least a part of the third opening 432. For example, the first via pad 434a may be formed to extend from an area of the third layer 430 to the third opening 432 adjacent to the via 450. At least a part of the first via pad 434a may be exposed in the first direction (e.g., the +Z-direction) through the first opening 412. According to an embodiment, the second via pad 444a may be positioned in at least a part of the fourth opening 442. For example, the second via pad 444a may be formed to extend from an area of the fourth layer 440 to the fourth opening 442 adjacent to the via 450. The second via pad 444a may be at least partially exposed in the second direction (e.g., the −Z-direction) opposite to the first direction (the +Z-direction) through the second opening 422. The configurations of the first via pad 434a and the second via pad 444a in FIG. 7 and FIG. 8 may be entirely or partially the same as the configurations of the via pad 408 in FIG. 6.

According to various embodiments, the first conductive member 434 may include the first via pad 434a for covering at least a part of the via 450 and the first wire line 434b for delivering a signal. The first wire line 434b may be electrically connected to the via 450 through the first via pad 434a. According to an embodiment, the first via pad 434a may be formed integrally with the first wire line 434b.

According to various embodiments, the second conductive member 444 may include a second via pad 444a for covering at least a part of the via 450 and a second wire line 444b for delivering a signal. The second wire line 444b may be electrically connected to the via 450 through the second via pad 444a. According to an embodiment, the second via pad 444a may be formed integrally with the second wire line 444b.

According to various embodiments, the ground wire 404 may be disposed to form a capacitive coupling with at least one of the first via pad 434a and/or the second via pad 444a. According to an embodiment, the first ground wire 414 may be disposed to form a capacitive coupling with the first via pad 434a. For example, the first ground wire 414 may be a wire crossing the first opening 412 of the first ground 416. At least a part of the first ground wire 414 may face at least a part of the first via pad 434a. According to an embodiment, the second ground wire 424 may be disposed to form a capacitive coupling with the second via pad 444a. For example, the second ground wire 424 may be a wire crossing the second opening 422 of the second ground 426. At least a part of the second ground wire 424 may face at least a part of the second via pad 444a. According to an embodiment, the ground wire 404 may form a capacitive coupling with the first wire line 434b and/or the second wire line 444b. For example, at least a part of the first ground wire 414 may overlap at least a part of the first wire line 434b, and the first ground wire 414 may form a capacitive coupling with the first via pad 434a and the first wire line 434b. As another example, at least a part of the second ground wire 424 may overlap at least a part of the second wire line 444b, and the second ground wire 424 may form a capacitive coupling with the second via pad 444a and the second wire line 444b.

According to various embodiments, the ground wire 404 may be formed to have a structure for stably maintaining the impedance of a signal passing through the via 450. According to an embodiment, the width of the ground wire 404 and the width of the via 450 may be formed to have a preset ratio. For example, a third width w3, which is the width of the via 450, may be formed greater than the first width w1 which is the width of the first ground wire 414, and/or the second width w2 which is the width of the second ground wire 424. For example, the third width w3 may be formed as large as a designated ratio (e.g., about three times) with respect to the first width w1 and/or the second width w2. According to another embodiment, an area, in which the ground wire 404 faces the first via pad 434a or the second via pad 444a, may be formed to have the thickness of an insulating layer 470 and a preset ratio. For example, the first thickness t1, which is the thickness of a first insulating layer 473, may be greater than the first width w1 of the first ground wire 414. In addition, the fourth width w4, which is the width of the first via pad 434a, may be greater than the first width w1 of the first ground wire 414. As another example, the third thickness t3, which is the thickness of a third insulating layer 477, may be greater than the second width w2 of the second ground wire 424. In addition, the fourth width w4, which is the width of the second via pad 444a, may be greater than the second width w2 of the second ground wire 424. For example, the fourth width w4 may be formed as large as a designated ratio (e.g., about six times) with respect to the first width w1 and/or the second width w2. According to various embodiments, the widths of the first via pad 434a and the second via pad 444a are not limited to the illustrated fourth width w4, and the first via pad 434a and the second via pad 444a may be formed to have widths different from each other. According to an embodiment, the first width w1 and the second width w2 may be formed to be about 45 μm. According to an embodiment, the third width w3 may be formed to be about 150 μm, and the fourth width w4 may be formed to be about 300 μm.

According to various embodiments, at least a part of the via 450 may be surrounded by multiple layers. For example, at least a part of the via 450 may be surrounded by the first via pad 434a and the second via pad 444a. According to an embodiment, the via 450 may be disposed between multiple conductive layers (e.g., the third layer 430 and the fourth layer 440). For example, the via 450 may be disposed between a first via pad 434a and a second via pad 444a. According to other embodiments, the via 450 may extend through at least a part of multiple conductive layers (e.g., the third layer 430 and the fourth layer 440). For example, the via 450 may extend through the first via pad 434a and the second via pad 444a.

According to various embodiments, the printed circuit board 400 may include the ground via 460. The ground via 460 may be connected to the ground 406 and thus may stably maintain the potential of the printed circuit board 400. For example, the ground via 460 may be formed through the first layer 410 in which the first ground 416 is disposed and the second layer 420 in which the second ground 426 is disposed.

According to various embodiments, the printed circuit board 400 may include the insulating layer 470. The insulating layer 470 may separate elements (e.g., the first via pad 434a and the second via pad 444a) of the printed circuit board 400.

According to various embodiments, the insulating layer 470 may include multiple layers. For example, the insulating layer 470 may include the first insulating layer 473 disposed between the first layer 410 and the third layer 430, the second insulating layer 475 disposed between the third layer 430 and the fourth layer 440, and the third insulating layer 477 disposed between the fourth layer 440 and the second layer 420. According to an embodiment, the first insulating layer 473 may be disposed between the first ground wire 414 and the first via pad 434a. The first ground wire 414 and the first via pad 434a may be disposed to be spaced apart by the first thickness t1 which is the thickness of the first insulating layer 473. According to another embodiment, the second insulating layer 475 may be disposed between the first via pad 434a and the second via pad 444a and may surround the via 450. The first via pad 434a and the second via pad 444a may be disposed to be spaced apart by a second thickness t2 which is the thickness of the second insulating layer 475. According to another embodiment, the third insulating layer 477 may be disposed between the second via pad 444a and the second ground wire 424. The second ground wire 424 and the second via pad 444a may be disposed to be spaced apart by the third thickness t3 which is the thickness of the third insulating layer 477.

According to various embodiments, the thicknesses of the insulating layer 470 may be variously formed. According to an embodiment, the first thickness t1 of the first insulating layer 473 and the third thickness t3 of the third insulating layer 477 may be differently formed. According to an embodiment, when the first opening 412 is formed in the first layer 410 and the opening is not formed in the second layer 420 (not shown), the third thickness t3 of the third insulating layer 477 may be greater than the first thickness t1 of the first insulating layer 473.

According to various embodiments, the insulating layer 470 may include a fourth insulating layer 471 disposed on the upper part (e.g., the +Z-direction) of the first insulating layer 473 or a fifth insulating layer 479 disposed on the lower part (e.g., the −Z-direction) of the third insulating layer 477.

According to an embodiment, the first thickness t1 of the first insulating layer 473 and/or the second thickness t2 of the second insulating layer 475 may be formed to be about 50 μm, and the third thickness t3 of the third insulating layer 477 may be formed to be about 85 μm. According to an embodiment, the thicknesses of the fourth insulating layer 471 and/or fifth insulating layer 479 may be formed to be about 24 μm.

According to various embodiments, the insulating layer 470 may be formed of various materials. For example, the insulating layer 470 may include at least one of polyimide, polyester, and polytetrafluoroethylene.

Figure 9:
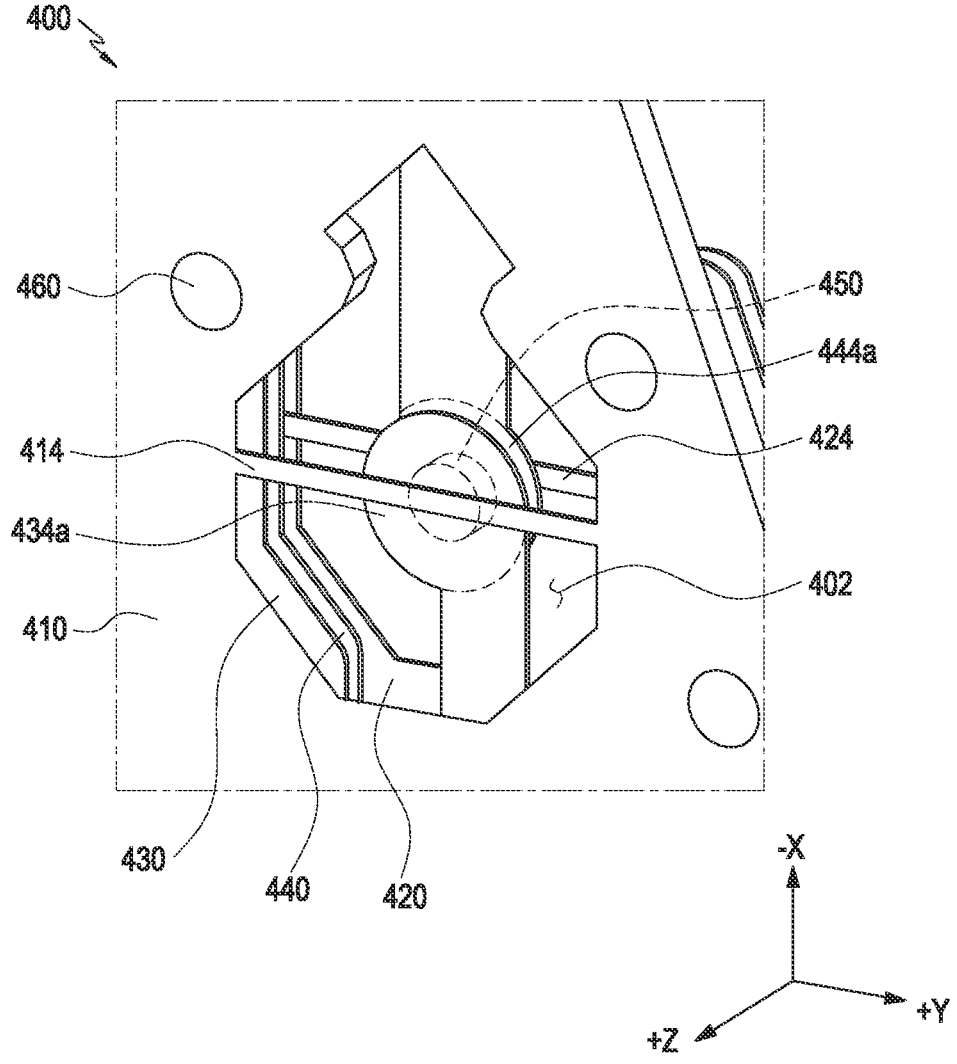
FIG. 9 is a perspective view of a printed circuit board according to an embodiment of the present disclosure.
Figure 10:
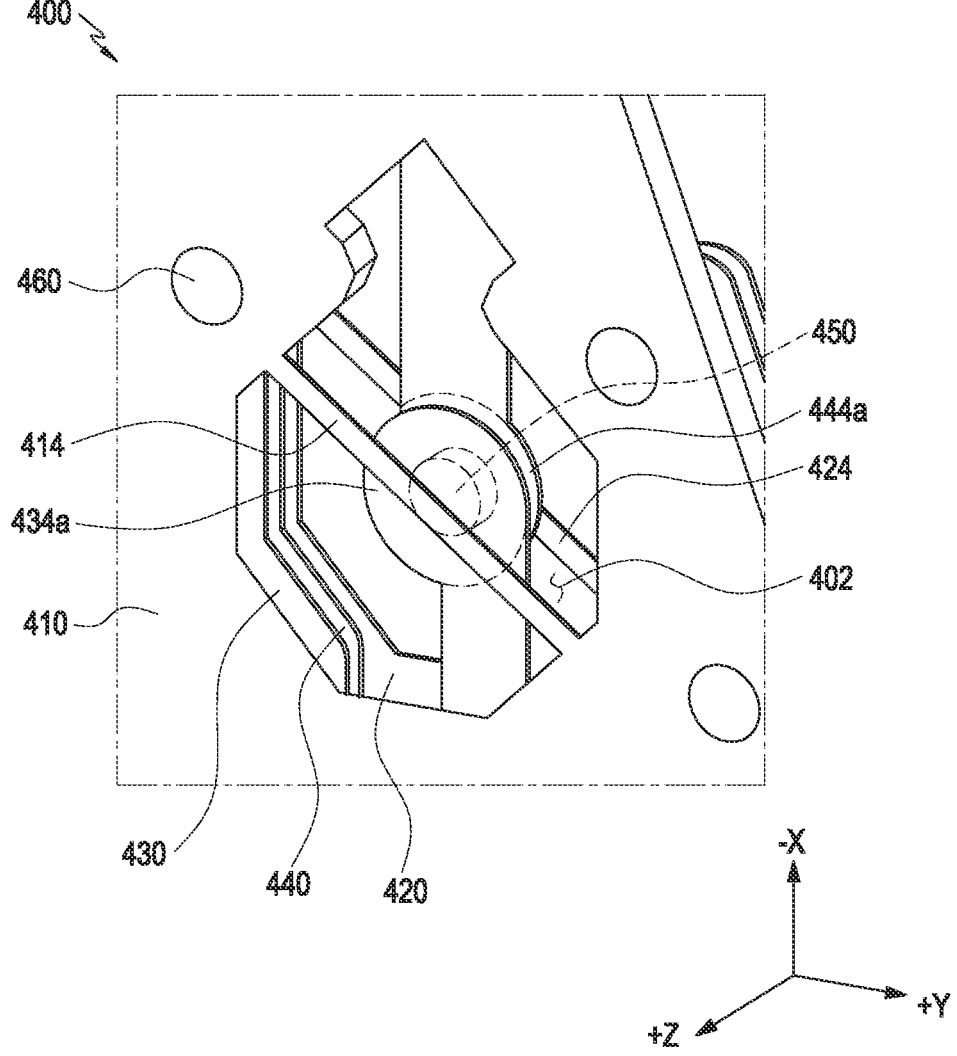
FIG. 10 is a perspective view of a printed circuit board according to another embodiment of the present disclosure.
Figure 11:
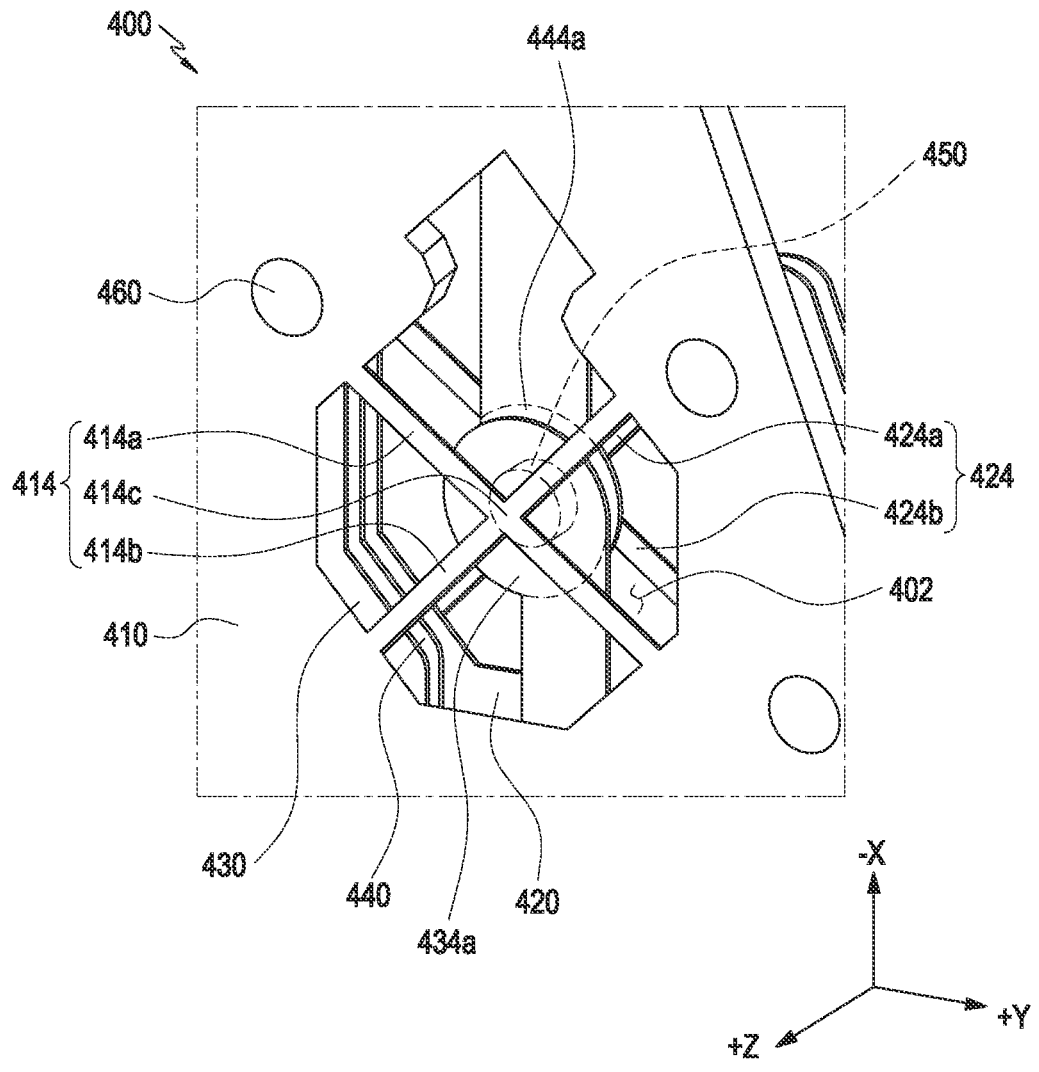
FIG. 11 is a perspective view of a printed circuit board according to another embodiment of the present disclosure.
Figure 12:
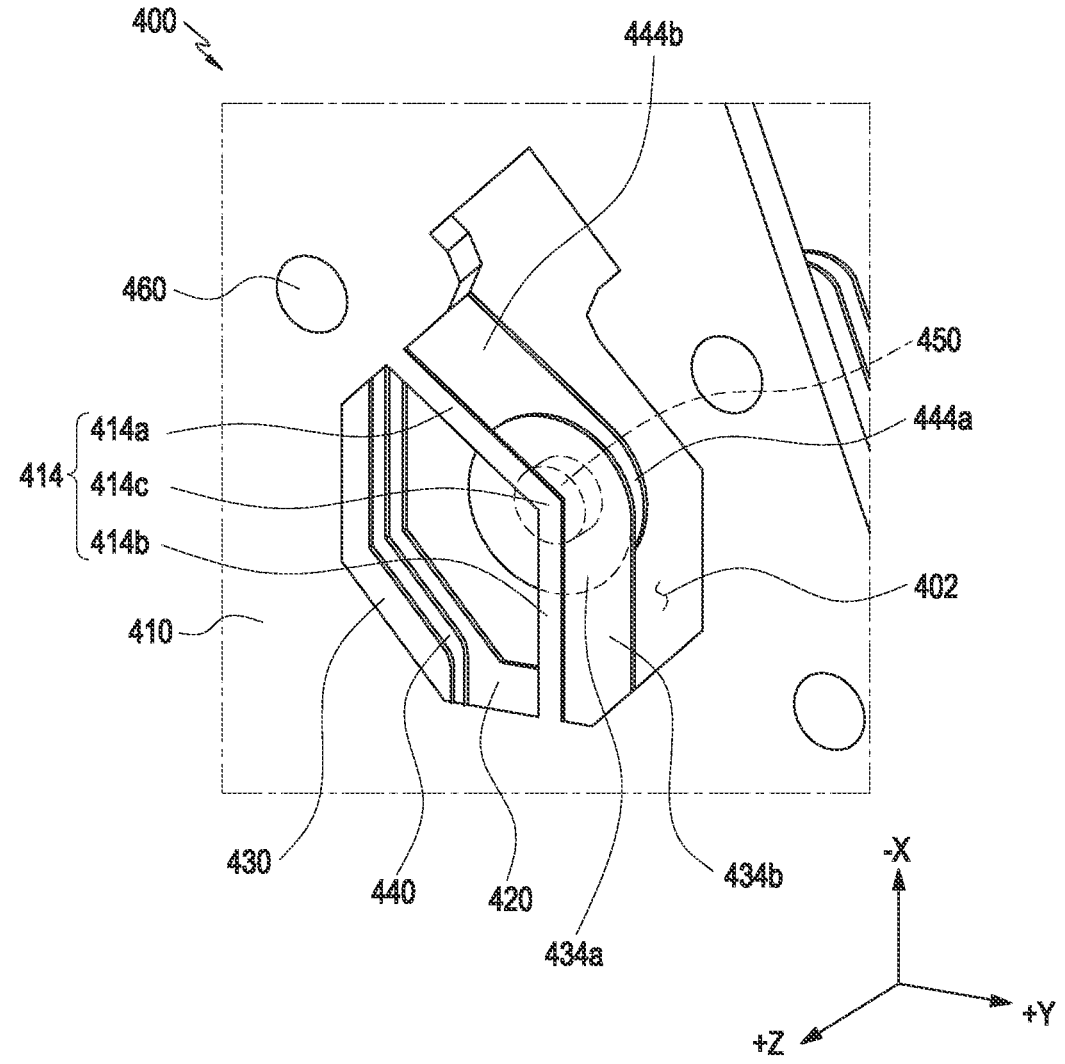
FIG. 12 is a perspective view of a printed circuit board according to another embodiment of the present disclosure.
Figure 13:
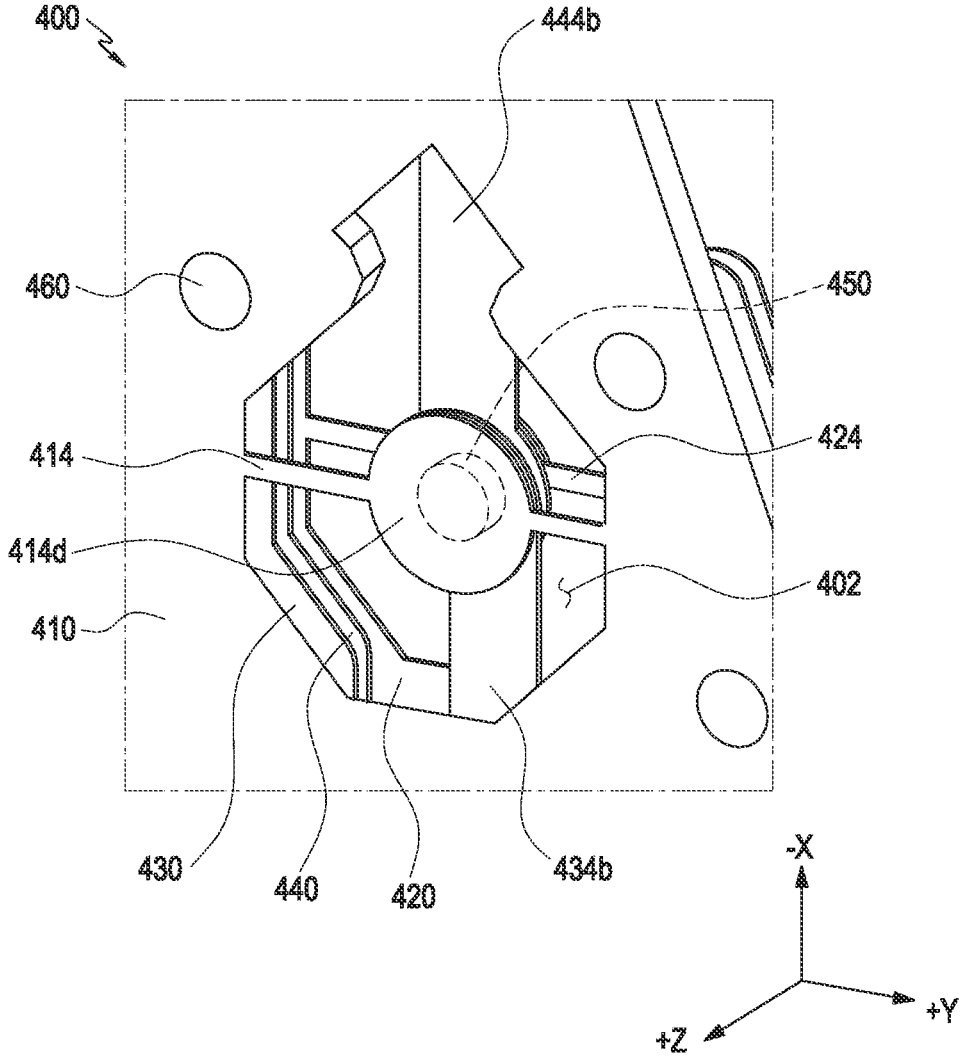
FIG. 13 is a perspective view of a printed circuit board according to another embodiment of the present disclosure.

FIG. 9 is a perspective view of a printed circuit board according to an embodiment of the present disclosure. FIG. 10 is a perspective view of a printed circuit board according to another embodiment of the present disclosure. FIG. 11 is a perspective view of a printed circuit board according to another embodiment of the present disclosure. FIG. 12 is a perspective view of a printed circuit board according to another embodiment of the present disclosure. FIG. 13 is a perspective view of a printed circuit board according to another embodiment of the present disclosure. At least one of elements of the printed circuit board 400 according to various embodiments of the present disclosure may be the same as or similar to at least one of the elements of the printed circuit board 400 in FIG. 6 to FIG. 8, and thus overlapping descriptions thereof will be omitted.

According to FIG. 9 to FIG. 13, the printed circuit board 400 may include an opening 402, a first ground wire 414, a second ground wire 424, a first via pad 434a, and a second via pad 444a. The configurations of the first ground wire 414, the second ground wire 424, the first via pad 434a, and the second via pad 444a in FIG. 9 to FIG. 13 may be entirely or partially the same as the configurations of the opening 402, the first ground wire 414, the second ground wire 424, the first via pad 434a, and the second via pad 444a in FIG. 6 to FIG. 8. For the convenience of explanation, although FIG. 9 to FIG. 13 illustrate that an insulating layer is omitted, according to an embodiment, the printed circuit board 400 may include an insulating layer 470 in FIG. 8.

According to various embodiments, at least a part of the first ground wire 414 and/or second ground wire 424 disposed in the opening 402 may be disposed to overlap at least a part of the via 450. For example, at least a part of the first ground wire 414 may face the first via pad 434a, and at least a part of the second ground wire 424 may face the second via pad 444a.

According to various embodiments, the first ground wire 414 and/or the second ground wire 424 may be positioned in the opening 402 of the printed circuit board 400. For example, the first ground wire 414 may be disposed on substantially the same plane as the first layer 410, and the second ground wire 424 may be disposed on substantially the same plane as the second layer 420. The first ground wire 414 may form a capacitive coupling with the first via pad 434a, and the second ground wire 424 may form a capacitive coupling with the second via pad 444a.

According to various embodiments, when the printed circuit board 400 is seen in the second direction (the −Z-direction), the first ground wire 414 and/or the second ground wire 424 may be disposed to have various angles (e.g., about 45 degrees or about 90 degrees) with a first wire line (e.g., the first wire line 434b in FIG. 7) and/or a second wire line (e.g., the second wire line 444b in FIG. 7). For example, referring to FIG. 9, the first ground wire 414 and/or the second ground wire 424 may be formed to have a substantially right angle with a first wire line (e.g., the first wire line 434b in FIG. 7) and/or a second wire line (e.g., the second wire line 444b in FIG. 7). For example, referring to FIG. 10, the first ground wire 414 and/or the second ground wire 424 may be formed to have an angle of substantially about 45 degrees with a first wire line (e.g., the first wire line 434b in FIG. 7) and/or a second wire line (e.g., the second wire line 444b in FIG. 7).

According to various embodiments, the printed circuit board 400 may include the ground via 460. The first layer 410 and the second layer 420 of the printed circuit board 400 may be electrically connected through the ground via 460. For example, the first ground wire 414 may be connected to one end of the ground via 460, and the second ground wire 424 may be connected to the other end of the ground via 460.

According to various embodiments, the first ground wire 414 and/or the second ground wire 424 may be formed in plural.

According to various embodiments, referring to FIG. 11 and FIG. 12, the first ground wire 414 may include a (1-1)th ground wire 414a and a (1-2)th ground wire 414b crossing the (1-1)th ground wire 414a. According to an embodiment, the first ground wire 414 may include a first central area 414c in which the (1-1)th ground wire 414a and the (1-2)th ground wire 414b overlap, and when the printed circuit board 400 is seen from the above (the +Z-direction), the first central area 414c may overlap at least a part of the via 450. According to another embodiment, when the printed circuit board 400 is seen from the above, the first central area 414c may overlap at least a part of the via 450 and at least a part of the first via pad 434a. According to an embodiment, the (1-1)th ground wire 414a and the (1-2)th ground wire 414b may be arranged in different directions with reference to the first central area 414c. According to an embodiment, when the printed circuit board 400 is seen from the above (the +Z-direction), the (1-1)th ground wire 414a and the (1-2)th ground wire 414b may be formed to have an angle (e.g., about 90 degrees) with respect to each other.

According to various embodiments, the second ground wire 424 may include a (2-1)th ground wire 424a and a (2-2)th ground wire 424b crossing the (2-1)th ground wire 424a. According to an embodiment, the second ground wire 424 may include a second central area (not shown) in which the (2-1)th ground wire 424a and the (2-2)th ground wire 424b overlap, and when the printed circuit board 400 is seen from the above (the +Z-direction), the second central area may overlap at least a part of the via 450. For example, the second central area (not shown) may be an area corresponding to the first central area 414c. According to another embodiment, when the printed circuit board 400 is seen from the above, the second central area may overlap at least a part of the via 450 and at least a part of the second via pad 444a. According to an embodiment, the (2-1)th ground wire 424a and the (2-2)th ground wire 424b may be arranged in different directions with reference to the second central area. According to an embodiment, when the printed circuit board 400 is seen from the above (the +Z-direction), the (2-1)th ground wire 424a and the (2-2)th ground wire 424b may be formed to have an angle (e.g., about 90 degrees or about 135 degrees) with respect to each other.

According to various embodiments, the first ground wire 414 may be formed in various shapes. For example, when the printed circuit board 400 is seen in the second direction (the −Z-direction), the first ground wire 414 may be disposed to overlap at least a part of the first wire line 434b and the second wire line 444b. According to an embodiment, the first ground wire 414 may include the (1-1)th ground wire 414a disposed to correspond to the second wire line 444b, and the (1-2)th ground wire 414b disposed to correspond to the first wire line 434b. According to an embodiment, the first wire line 434b and the second wire line 444b may be arranged at various angles (e.g., about 180 degrees or about 135 degrees).

According to various embodiments, referring to FIG. 13, the first layer 410 may include a first ground shielding 414d. The first ground shielding 414d may be formed to protrude from a partial area of the first ground wire 414. For example, when the printed circuit board 400 is seen in the second direction (the −Z), the first ground shielding 414d may overlap at least a part of the first via pad 434a. According to an embodiment, at least a part of the first ground shielding 414d may form a capacitive coupling with the first via pad 434a.

According to various embodiments, the printed circuit board 400 may include a via (e.g., the via 450 in FIGS. 6 and 7). When the via 450 is seen in the second direction (the −Z-direction), the via 450 may not be exposed in the first direction (the +Z-direction) by the first ground shielding 414d. According to various embodiments, the second layer 420 may include a second ground shielding (not shown). The second ground shielding may be a configuration corresponding to the first ground shielding 414d. For example, the second ground shielding may have a structure protruding from a partial area of the second ground wire 424. According to an embodiment, when the printed circuit board 400 is seen from the above, the second ground shielding may overlap at least a part of the second via pad 444a. According to another embodiment, when the printed circuit board 400 is seen in the second direction (the −Z-direction), the first ground shielding 414d, the first via pad 434a, the second via pad 444a, and the second ground shielding (not shown) may overlap one another.

Figure 14:
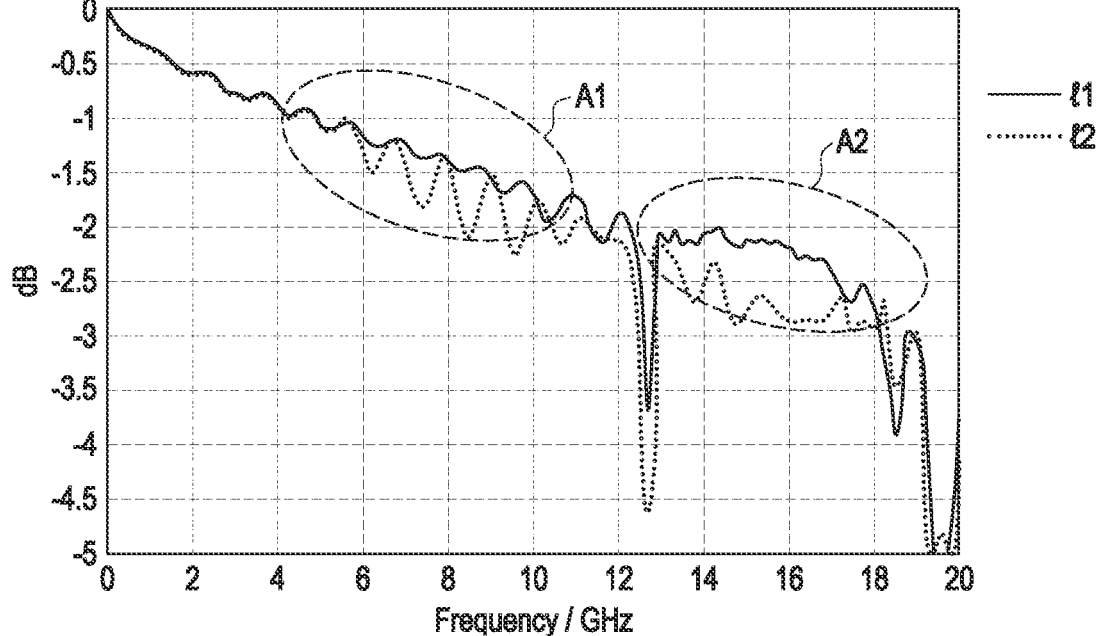
FIG. 14 is a graph showing an S-parameter of an electronic device according to various embodiments of the present disclosure.

FIG. 14 is a graph showing an S-parameter of an electronic device according to various embodiments of the present disclosure.

According to FIG. 14, the S parameter of an electronic device (e.g., the electronic device 101 in FIG. 1) may be changed based on a structure of a printed circuit board (e.g., the printed circuit board 400 in FIG. 6). For example, a first waveform 11 may be the S parameter of an electronic device (e.g., the electronic device 101 in FIG. 1) including a printed circuit board (e.g., the printed circuit board 400 in FIG. 6)

on which a ground wire (e.g., the ground wire 404 in FIG. 6) is disposed, and a second waveform 12 may be the S parameter of an electronic device including a printed circuit board on which a ground wire is not disposed. According to an embodiment, in a first frequency range A1 which is a frequency range from 4 GHz to 11 GHz and a second frequency range A2 from 13 GHz to 18 GHz, the first waveform 11 may obtain a more stable S parameter than the second waveform 12. For example, in the first frequency range A1 and the second frequency range A2, the decibel (dB) deviation of the first waveform 11 may be smaller than the decibel deviation of the second waveform 12.

According to various embodiments of the present disclosure, a printed circuit board (e.g., the printed circuit board 400 in FIG. 5) may include a first layer (e.g., the first layer 410 in FIG. 7) oriented in a first direction (e.g., the first direction (the +Z-direction) in FIG. 7), the first layer (e.g., the first layer 410 in FIG. 7) including a first ground (e.g., the first ground 416 in FIG. 7) in which a first opening (e.g., first opening 412 in FIG. 7) is formed, wherein a first ground wire (e.g., the first ground wire 414 in FIG. 7) is positioned in the first opening, a second layer (e.g., the second layer 420 in FIG. 7) oriented in a second direction (e.g., the second direction (the −Z-direction) in FIG. 7) opposite to the first direction, the second layer (e.g., the second layer 420 in FIG. 7) including a second ground (e.g., the second ground 426 in FIG. 7) in which a second opening (e.g., the second opening 422 in FIG. 7) is formed, wherein the second opening corresponds to at least a part of the first opening and a second ground wire (e.g., the second ground wire 424 in FIG. 7) is positioned in the second opening, a third layer (e.g., the third layer 430 in FIG. 7) disposed between the first layer and the second layer and including a third opening (e.g., the third opening 432 in FIG. 7) which corresponds to at least a part of the first opening and in which a first via pad (e.g., the first via pad 434a in FIG. 7) is positioned, a fourth layer (e.g., the fourth layer 440 in FIG. 7) disposed between the second layer and the third layer and including a fourth opening (e.g., the fourth opening 442 in FIG. 7) which corresponds to at least a part of the third opening and in which a second via pad (e.g., the second via pad 444a in FIG. 7) is positioned, and a via (e.g., the via 450 in FIG. 7) at least partially surrounded by the first via pad and the second via pad.

According to various embodiments, the first ground wire may be configured to form a capacitive coupling with the first via pad, and the second ground wire may be configured to form a capacitive coupling with the second via pad.

According to various embodiments, when the printed circuit board is seen in the second direction, the first ground wire and the second ground wire may overlap at least a part of the via.

According to various embodiments, the first ground wire may include a (1-1)th ground wire (e.g., the (1-1)th ground wire 414a in FIG. 11) and a (1-2)th ground wire (e.g., the (1-2)th ground wire 414b in FIG. 11) crossing the (1-1)th ground wire, and the second ground wire includes a (2-1)th ground wire (e.g., the (2-1)th ground wire 424a in FIG. 11) and a (2-2)th ground wire (e.g., the (2-2)th ground wire 424b in FIG. 11) crossing the (2-1)th ground wire.

According to various embodiments, the first ground wire may include a first central area (e.g., the first central area 414c in FIG. 11) in which the (1-1)th ground wire and the (1-2)th ground wire overlap, the second ground wire may include a second central area (e.g., the second central area 424c in FIG. 11) in which the (2-1)th ground wire and the (2-2)th ground wire overlap, and when the printed circuit board is seen in the second direction, at least a part of the first central area and the second central area may overlap at least a part of the via.

According to various embodiments, the third layer may include a first wire line (e.g., the first wire line 434*b* in FIG. 7) extending from the first via pad, and the fourth layer may include a second wire line (e.g., the second wire line 444*b* in FIG. 7) extending from the second via pad.

According to various embodiments, when the printed circuit board is seen in the second direction, at least a part of the first ground wire may overlap at least a part of the first wire line, and at least a part of the second ground wire may overlap at least a part of the second wire line.

According to various embodiments, the width of the first ground wire may be smaller than the width of the first via pad, and the width of the second ground wire may be smaller than the width of the second via pad.

According to various embodiments, the printed circuit board may further include at least one first connection member (e.g., the first connection member 482 in FIG. 5) configured to be connected to an antenna module (e.g., the antenna module 197 in FIG. 1), and a second connection member (e.g., the second connection member 484 in FIG. 5) configured to be connected to a communication module (e.g., the communication module 190 in FIG. 1).

According to various embodiments, the via may include a first via (e.g., the first via 450*a* in FIG. 6) connected to the first connection member and a second via (e.g., the second via 450*b* in FIG. 6) connected to the second connection member.

According to various embodiments, the printed circuit board may further include a first substrate (e.g., the first substrate 400*a* in FIG. 6) which is flexible and at least one second substrate (e.g., the second substrate 400*b* in FIG. 6) extending from the first substrate, and the first via pad and the second via pad may be electrically connected to at least one of the first substrate or the second substrate.

According to various embodiments, when the printed circuit board is seen in the second direction, the first ground wire may at least partially overlap the second ground wire.

According to various embodiments, the first ground wire may include a first ground shielding (e.g., the first ground shielding 414*d* in FIG. 12) corresponding to the first pad, the second ground wire may include a second ground shielding corresponding to the second pad, and when the printed circuit board is seen in the second direction, the first ground shielding and the second ground shielding at least partially overlap each other.

According to various embodiments, the printed circuit board may further include a ground via (e.g., the ground via 460 in FIG. 8) extending through the first layer, the second layer, the third layer, and the fourth layer, and the first ground wire and the second ground wire may be electrically connected through the ground via.

According to various embodiments, a first insulating layer (e.g., the first insulating layer 473 in FIG. 8) disposed between the first ground wire and the first via pad, a second insulating layer (e.g., the second insulating layer 475 in FIG. 8) which is disposed between the first via pad and the second via pad and surrounds at least a part of the via, and a third insulating layer (e.g., the third insulating layer 477 in FIG. 8) disposed between the second ground wire and the second via pad, may be further included therein.

According to various embodiments of the present disclosure, a printed circuit board (e.g., the printed circuit board 400 in FIG. 5) may include a first layer (e.g., the first layer 410 in FIG. 7) oriented in a first direction (e.g., the +Z-direction in FIG. 7), the first layer (e.g., the first layer 410 in FIG. 7) including a first ground (e.g., the first ground 416 in FIG. 7) having a first opening (e.g., first opening 412 in FIG. 7) formed therethrough in which a first ground wire (e.g., the first ground wire 414 in FIG. 7) is positioned, a second layer (e.g., the second layer 420 in FIG. 7) which is oriented in a second direction (e.g., the −Z-direction in FIG. 7) opposite to the first direction and includes a second ground (e.g., the second ground 426 in FIG. 7), a third layer (e.g., the third layer 430 in FIG. 7) which is disposed between the first layer and the second layer and through which a third opening (e.g., the third opening 432 in FIG. 7) corresponding to at least a part of the first opening is formed, the third layer (e.g., the third layer 430 in FIG. 7) including a first via pad (e.g., the first via pad 434*a* in FIG. 7) extending to the third opening, a fourth layer (e.g., the fourth layer 440 in FIG. 7) which is disposed between the second layer and the third layer and through which a fourth opening (e.g., the fourth opening 442 in FIG. 7) corresponding to at least a part of the third opening is formed, the fourth layer (e.g., the fourth layer 440 in FIG. 7) including a second via pad (e.g., the second via pad 444*a* in FIG. 7) extending to the fourth opening, and a via (e.g., the via 450 in FIG. 7) of which at least a part is surrounded by the first via pad and the second via pad.

According to various embodiments, when the printed circuit board is seen in the second direction, the first ground wire may overlap at least a part of the via.

According to various embodiments, the first ground wire may be configured to form a capacitive coupling with the first via pad, and the second ground may be configured to form a capacitive coupling with the second via pad.

According to various embodiments of the present disclosure, an electronic device (e.g., the electronic device 101 in FIG. 1) may include a display (e.g., the display 301 in FIG. 2), a battery (e.g., the battery 350 in FIG. 4) configured to supply power to the display, and a printed circuit board (e.g., the printed circuit board 400 in FIG. 6), wherein the printed circuit board may include a first layer (e.g., the first layer 410 in FIG. 7) including a first ground (e.g., the first ground 416 in FIG. 7) having a first opening (e.g., first opening 412 in FIG. 7) formed therethrough in which a first ground wire (e.g., the first ground wire 414 in FIG. 7) is positioned, a second layer (e.g., the second layer 420 in FIG. 7) including a second ground (e.g., the second ground 426 in FIG. 7) having a second opening (e.g., the second opening 422 in FIG. 7) formed therethrough which corresponds to at least a part of the first opening and in which a second ground wire (e.g., the second ground wire 424 in FIG. 7) is positioned, a third layer (e.g., the third layer 430 in FIG. 7) disposed between the first layer and the second layer and including a third opening (e.g., the third opening 432 in FIG. 7) which corresponds to at least a part of the first opening and in which a first via pad (e.g., the first via pad 434*a* in FIG. 7) is positioned, a fourth layer (e.g., the fourth layer 440 in FIG. 7) disposed between the second layer and the third layer including a fourth opening (e.g., the fourth opening 442 in FIG. 7) which corresponds to at least a part of the third opening and in which a second via pad (e.g., the second via pad 444*a* in FIG. 7) is positioned, and a via (e.g., the via 450 in FIG. 7) disposed between the first via pad and the second via pad.

According to various embodiments, the electronic device may further include an antenna module (e.g., the antenna module 197 in FIG. 1) and a communication module (e.g., the communication module 190 in FIG. 1) electrically connected to the antenna module, wherein the printed circuit board may include a first connection member (e.g., the first connection member 482 in FIG. 5) connected to the antenna module and a second connection member (e.g., the second connection member 484 in FIG. 5) connected to the communication module, and the via may be disposed adjacent to at least one of the first connection member or the second connection member.

Printed circuit boards including various ground wires of the present disclosure are not limited by the above-described example embodiments and drawings, and it will be understood by a person skilled in the technical field, to which the present disclosure belongs, that various substitutions, modifications, and changes are possible within the technical scope of the present disclosure.

What is claimed:

1. A printed circuit board comprising:
a first layer comprising a first ground including a first opening and a first ground wire within the first opening;
a second layer disposed in a direction from the first layer and comprising a second ground including a second opening and a second ground wire within the second opening, wherein the second opening at least partially overlaps with the first opening;
a third layer between the first layer and the second layer and including a third opening, a first via pad within the third opening, and a first wire line extending from the first via pad, wherein the third opening at least partially overlaps with the first opening;
a fourth layer between the second layer and the third layer and including a fourth opening, a second via pad within the fourth opening, and a second wire line extending from the second via pad, wherein the fourth opening at least partially overlaps with the third opening; and
a via at least partially surrounded by the first via pad and the second via pad,
wherein at least a portion of the first via pad and a least a portion of the first wire line are in a same first horizontal plane and extend along the same first horizontal plane,
wherein at least a portion of the second via pad and at least a portion of the second wire line are in a same second horizontal plane and extend along the same second horizontal plane,
wherein the first ground wire at least partially overlaps with the first via pad and the first wire line, and extends along the first wire line, and
wherein the second ground wire at least partially overlaps with the second via pad and the second wire line, and extends along the second wire line.

2. The printed circuit board of claim 1, wherein the first layer, the third layer, the fourth layer, and the second layer are sequentially stacked in the direction, and
wherein the first ground wire extends along the first wire line, and the second ground wire extends along the second ground wire.

3. The printed circuit board of claim 1, wherein, when the printed circuit board is seen in the direction, the first ground wire at least partially overlaps with the second wire line, and a width of the first ground wire is smaller than a width of the second wire line.

4. The printed circuit board of claim 3, wherein the first ground wire comprises a (1-1)th ground wire and a (1-2)th ground wire crossing the (1-1)th ground wire, and
the second ground wire comprises a (2-1)th ground wire and a (2-2)th ground wire crossing the (2-1)th ground wire.

5. The printed circuit board of claim 4, wherein the first ground wire comprises a first central area in which the (1-1)th ground wire and the (1-2)th ground wire overlap, and
at least a part of the first central area overlaps with at least a part of the via in the direction.

6. The printed circuit board of claim 1, wherein a width of the first ground wire is smaller than a width of the first via pad, and
a width of the second ground wire is smaller than a width of the second via pad.

7. The printed circuit board of claim 1, further comprising:
a first connection member connected to an antenna module; and
a second connection member connected to a communication module,
wherein the via is configured to transmit a signal between the antenna module and the communication module.

8. The printed circuit board of claim 1, further comprising:
a first substrate that is flexible; and
a second substrate connected to the first substrate, wherein the first ground wire, the second ground wire, the first via pad, the second via pad, and the via are positioned at the second substrate.

9. The printed circuit board of claim 1, wherein the first ground wire at least partially overlaps with the second ground wire in the direction.

10. The printed circuit board of claim 1, wherein the first ground wire comprises a first ground shielding corresponding to the first via pad,
the second ground wire comprises a second ground shielding corresponding to the second via pad, and
the first ground shielding and the second ground shielding at least partially overlap in the direction.

11. The printed circuit board of claim 1, further comprising a ground via extending through the first layer, the second layer, the third layer, and the fourth layer,
wherein the first ground wire and the second ground wire are electrically connected through the ground via.

12. An electronic device comprising:
the printed circuit board of claim 1;
a display; and
a battery configured to supply power to the display.

13. The printed circuit board of claim 1, wherein an extension direction of the first ground wire or the second ground wire is 90 degrees with respect to an extension direction of the first wire line or the second wire line.

14. The printed circuit board of claim 1, wherein an extension direction of the first ground wire or the second ground wire is 45 degrees with respect to an extension direction of the first wire line or the second wire line.

15. The printed circuit board of claim 4, wherein
an extension direction of the (1-1)th ground wire is 135 to 180 degrees with respect to an extension direction of (1-2)th ground wire,
the extension direction of the (1-1)th ground wire is the same as an extension direction of the first wire line, and the (1-1)th ground wire overlaps with the first wire line, and
the extension direction of the (1-2)th ground wire is the same as an extension direction of the second wire line, and the (1-2)th ground wire overlaps with the second wire line.

16. The printed circuit board of claim 1, further comprising:

a first insulating layer between the first layer and the third layer, wherein the first insulating layer has a thickness that is greater than a width of the first ground wire.

17. The printed circuit board of claim 16, further comprising:

a second insulating layer between the fourth layer and the second layer, wherein the second insulating layer has a thickness that is greater than the thickness of the first insulating layer.

18. The printed circuit board of claim 1, wherein the first layer, the fourth layer, the third layer, and the second layer are sequentially stacked in the direction, wherein, when the printed circuit board is seen in the direction:

the first ground wire and the second ground wire at least partially overlap with the via, the first opening, the second opening, the third opening, and the fourth opening at least partially overlap with each other, the first ground wire at least partially overlaps with the first via pad and the first wire line, and extends along the first wire line, and the second ground wire at least partially overlaps with the second via pad and the second wire line, and extends along the second ground wire.

19. The printed circuit board of claim 8, further comprising:

a first insulating layer between the first layer and the third layer, wherein the first ground wire and the first via pad are spaced apart from each other by a first thickness of the first insulating layer;

a second insulating layer between the third layer and the fourth layer, wherein the first via pad and the second via pad are spaced apart from each other by a second thickness of the second insulating layer; and a third insulating layer between the fourth layer and the second layer, wherein the second ground wire and the second via pad are spaced apart from each other by a third thickness of the third insulating layer greater than the first thickness, wherein a total number of conductive layers of the second substrate is greater than a total number of conductive layers of the first substrate.

* * * * *